(12) United States Patent
Baek et al.

(10) Patent No.: US 9,819,975 B2
(45) Date of Patent: Nov. 14, 2017

(54) APPARATUS FOR TRANSMITTING BROADCAST SIGNALS, APPARATUS FOR RECEIVING BROADCAST SIGNALS, METHOD FOR TRANSMITTING BROADCAST SIGNALS AND METHOD FOR RECEIVING BROADCAST SIGNALS

(71) Applicant: LG ELECTRONICS INC., Seoul (KR)

(72) Inventors: Jongseob Baek, Seoul (KR); Jaehyung Kim, Seoul (KR); Woosuk Ko, Seoul (KR); Sungryong Hong, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/909,345

(22) PCT Filed: Aug. 14, 2014

(86) PCT No.: PCT/KR2014/007586
§ 371 (c)(1),
(2) Date: Feb. 1, 2016

(87) PCT Pub. No.: WO2015/023148
PCT Pub. Date: Feb. 19, 2015

(65) Prior Publication Data
US 2016/0198197 A1 Jul. 7, 2016

Related U.S. Application Data

(60) Provisional application No. 61/865,626, filed on Aug. 14, 2013, provisional application No. 61/868,082, filed on Aug. 20, 2013.

(51) Int. Cl.
H04N 21/236 (2011.01)
H04N 21/2383 (2011.01)
(Continued)

(52) U.S. Cl.
CPC .......... *H04N 21/236* (2013.01); *H03M 13/27* (2013.01); *H04L 1/0071* (2013.01);
(Continued)

(58) Field of Classification Search
CPC ............. H04N 21/236; H04N 21/2383; H04N 21/434; H04N 21/4382; H04N 21/6379;
(Continued)

(56) References Cited

U.S. PATENT DOCUMENTS

2005/0201477 A1* 9/2005 Cho .................. H04L 5/0044
375/260
2009/0279418 A1* 11/2009 Scarpa ................ H04L 5/0007
370/206
(Continued)

FOREIGN PATENT DOCUMENTS

| EP | 2 541 926 A2 | 1/2013 |
| GB | 2456292 A | 7/2009 |
| GB | 2462749 A | 7/2009 |

OTHER PUBLICATIONS

Morello (DVB Organization), "Bwg M&I progress report to DVB-T2," Digital Video Broadcasting, Sep. 18-20, 2007, XP017817529, Slides 1-46.

*Primary Examiner* — Randy Flynn
(74) *Attorney, Agent, or Firm* — Birch, Stewart, Kolasch & Birch, LLP

(57) ABSTRACT

A method and an apparatus for transmitting broadcast signals thereof are disclosed. The apparatus for transmitting broadcast signals comprises an encoder for encoding service data, a mapper for mapping the encoded service data into a plurality of OFDM symbols to build at least one signal frame, a modulator for modulating data in the built at least one signal frame by an OFDM (Orthogonal Frequency
(Continued)

Division Multiplex) scheme and a transmitter for transmitting the broadcast signals having the modulated data.

4 Claims, 24 Drawing Sheets

(51) Int. Cl.
*H04N 21/438* (2011.01)
*H04N 21/6379* (2011.01)
*H04N 21/85* (2011.01)
*H04N 21/234* (2011.01)
*H04L 5/00* (2006.01)
*H04N 7/08* (2006.01)
*H03M 13/27* (2006.01)
*H04L 1/00* (2006.01)
*H04N 21/434* (2011.01)

(52) U.S. Cl.
CPC ........ *H04L 5/0007* (2013.01); *H04N 21/2383* (2013.01); *H04N 21/434* (2013.01); *H04N 21/4382* (2013.01); *H04N 21/6379* (2013.01); *H04N 21/85* (2013.01); *H04N 7/08* (2013.01); *H04N 21/234* (2013.01)

(58) Field of Classification Search
CPC ........ H04N 21/85; H04N 21/234; H04N 7/08; H04L 5/0007
See application file for complete search history.

(56) References Cited

U.S. PATENT DOCUMENTS

| 2010/0216421 | A1 | 8/2010 | Hsu |
| 2011/0078540 | A1 | 3/2011 | Hu et al. |
| 2012/0324513 | A1 | 12/2012 | Hwang et al. |
| 2012/0327879 | A1 | 12/2012 | Stadelmeier et al. |

* cited by examiner

[Fig. 1]
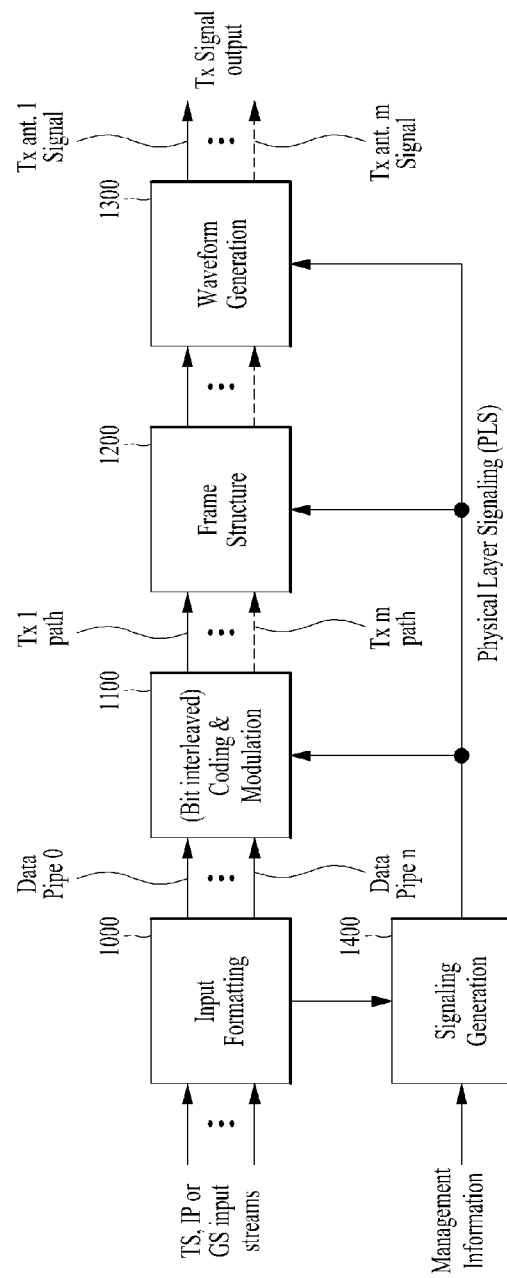

[Fig. 2]
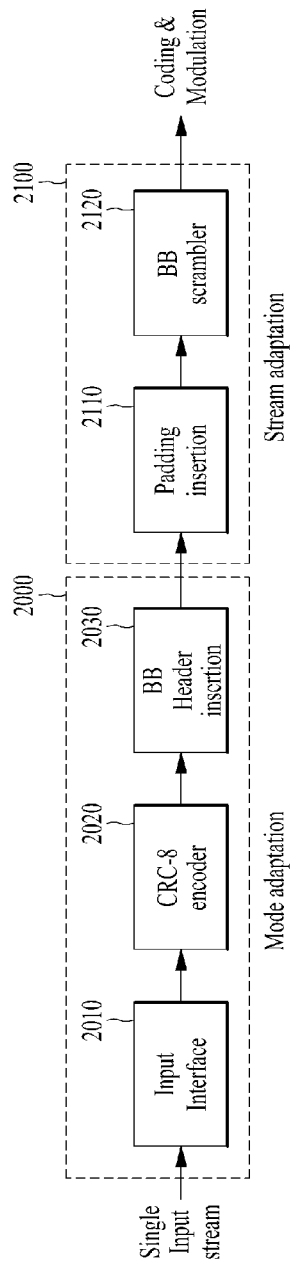

[Fig. 3]
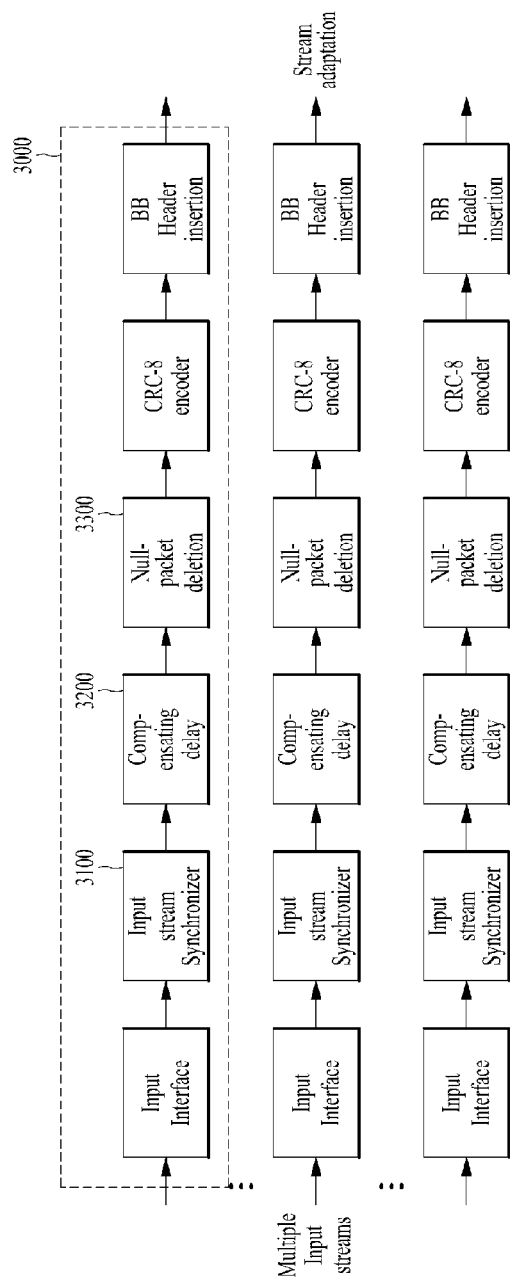

[Fig. 4]
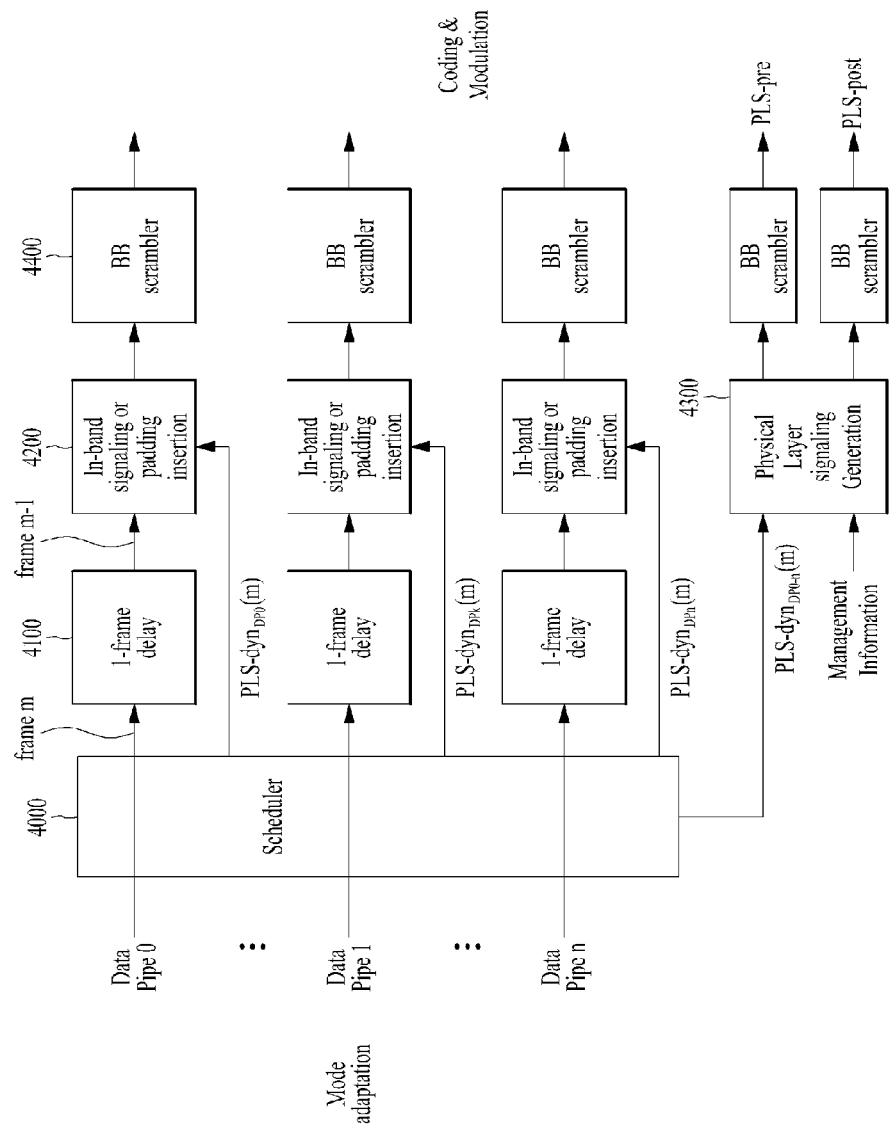

[Fig. 5]
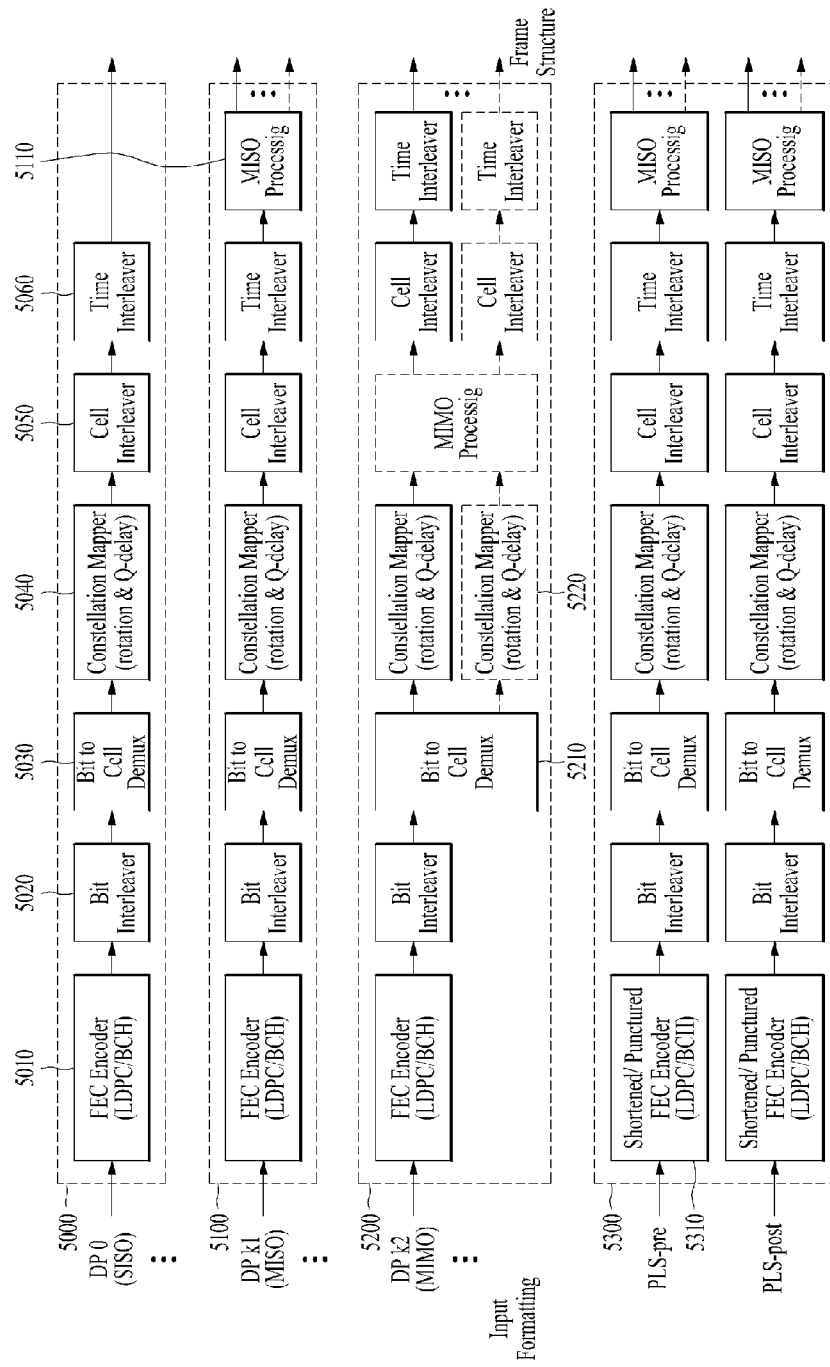

[Fig. 6]
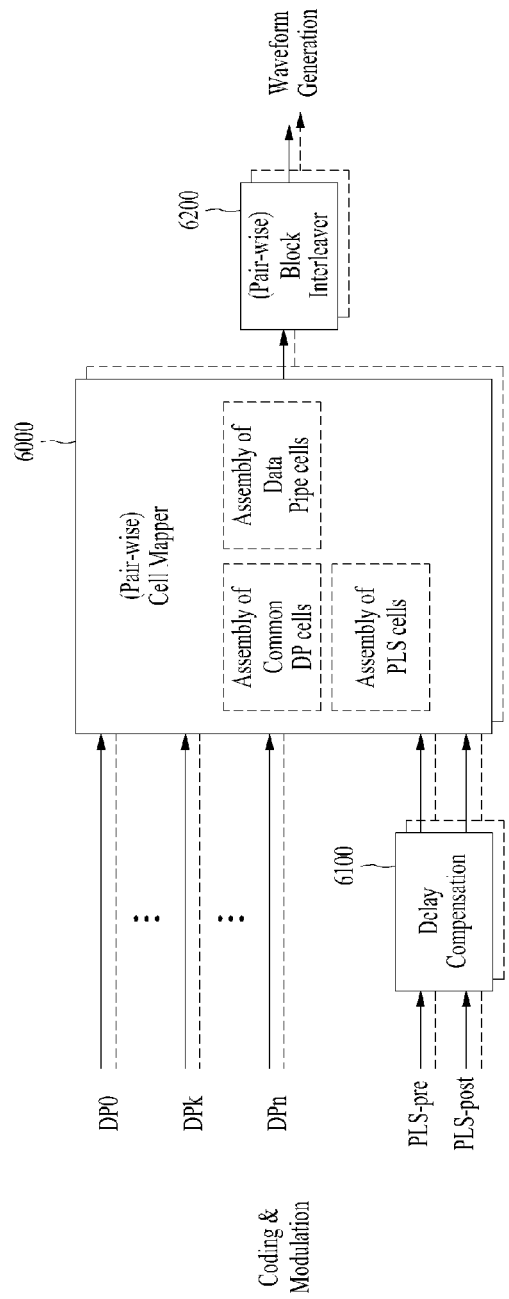

[Fig. 7]
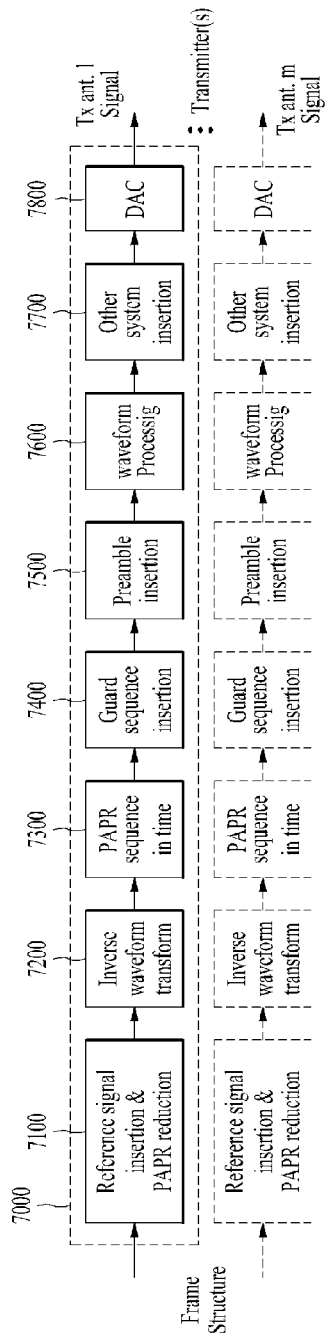

[Fig. 8]
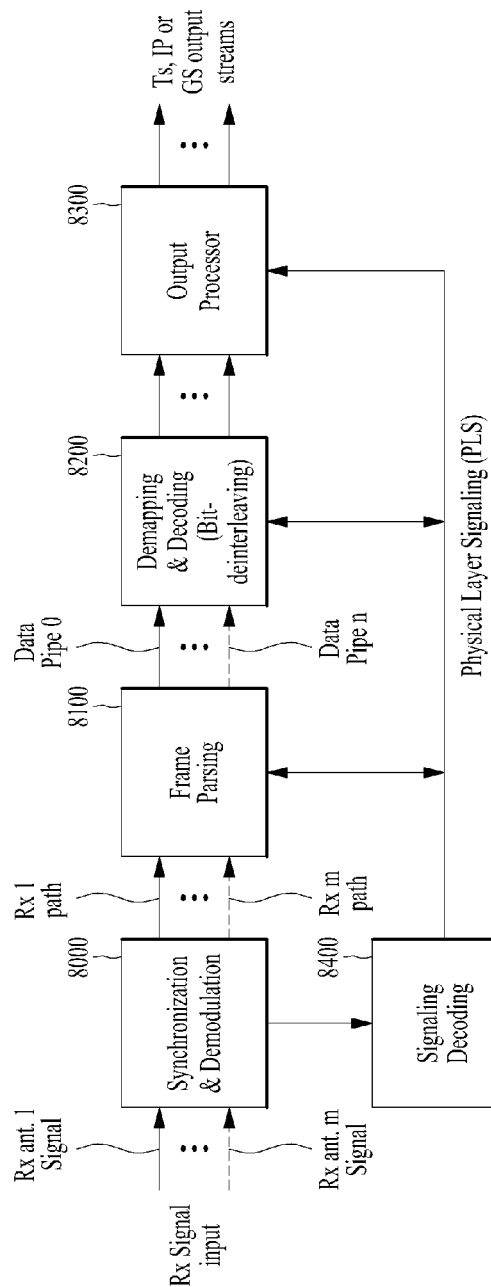

[Fig. 9]
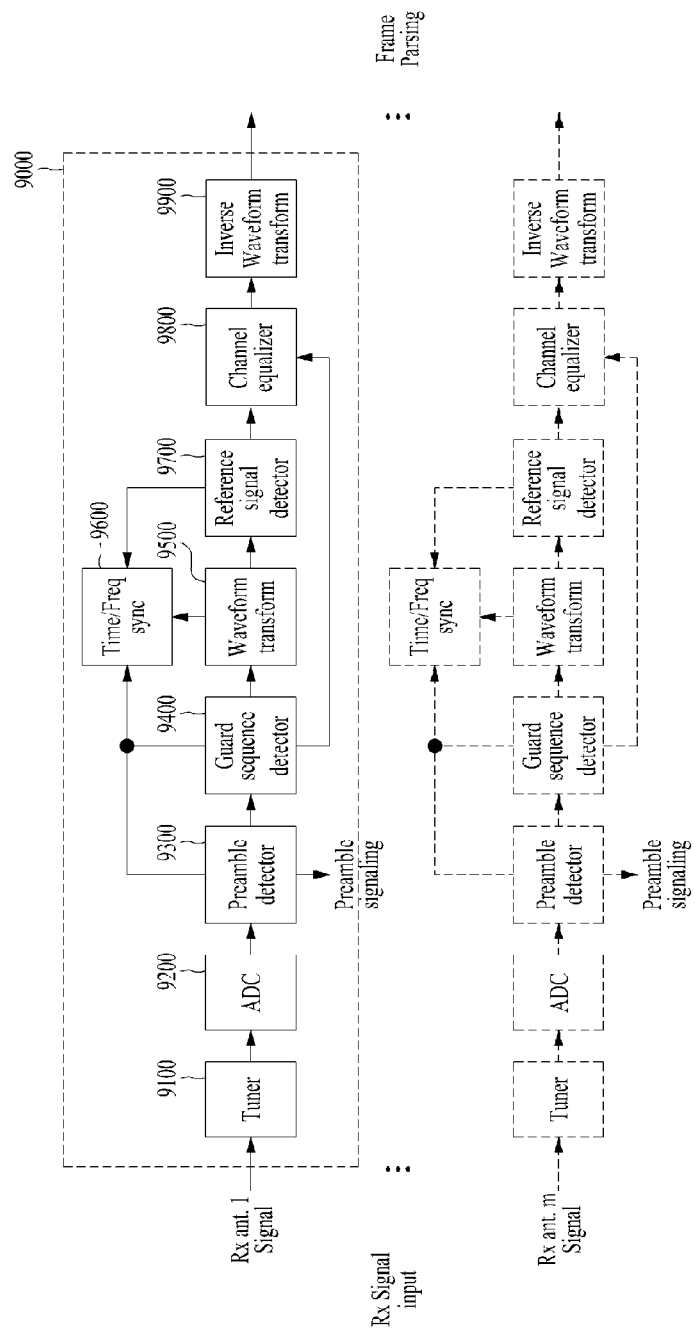

[Fig. 10]
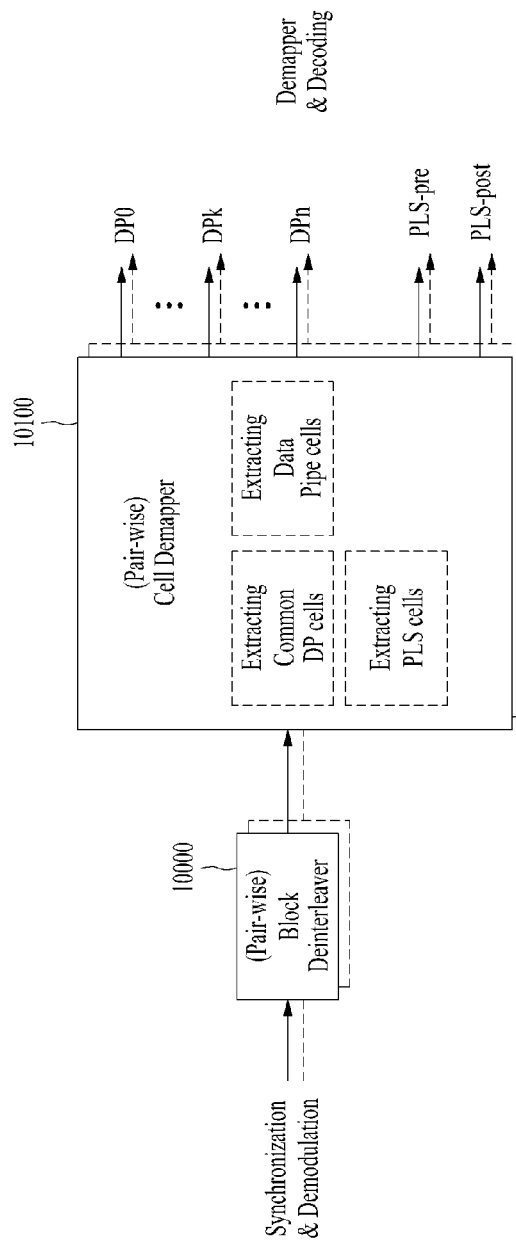

[Fig. 11]
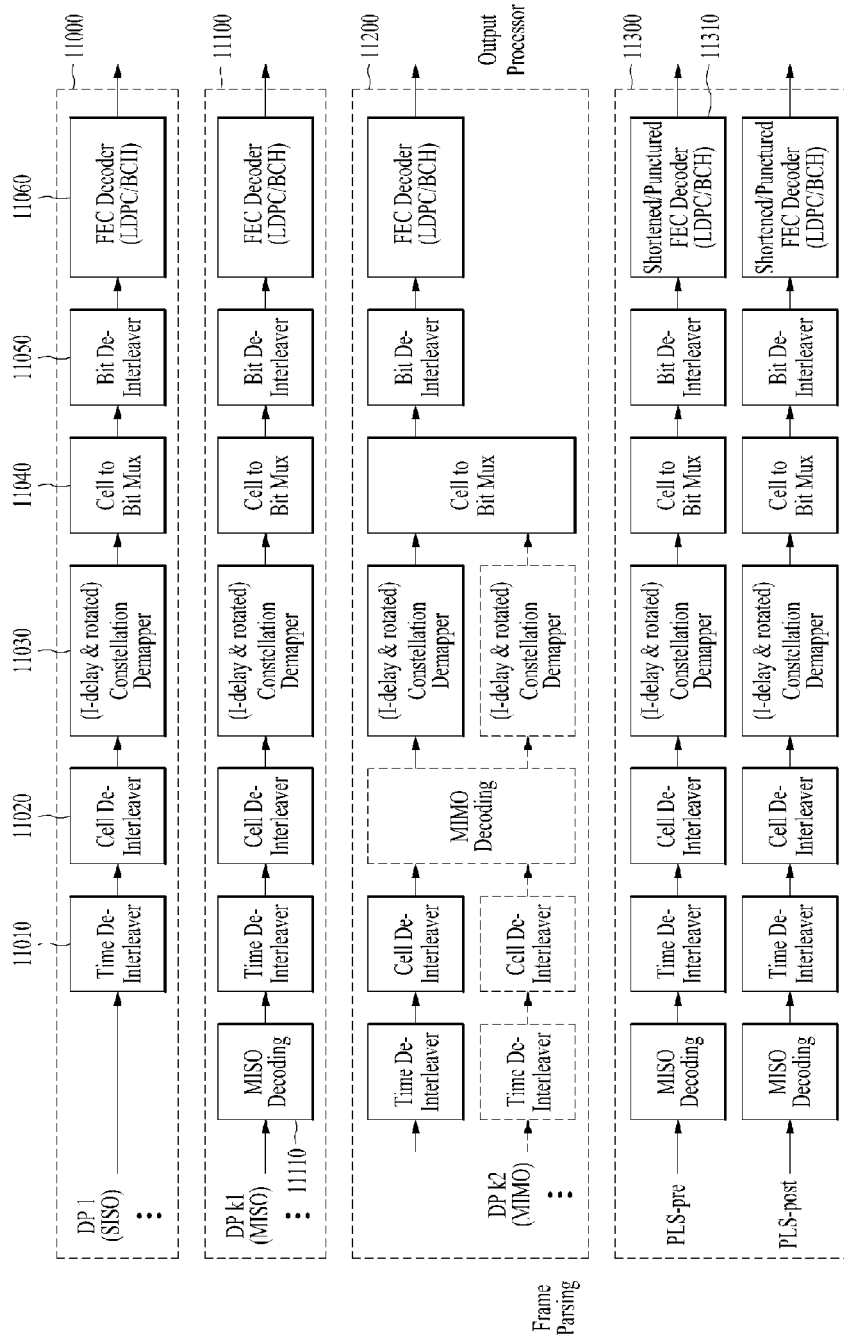

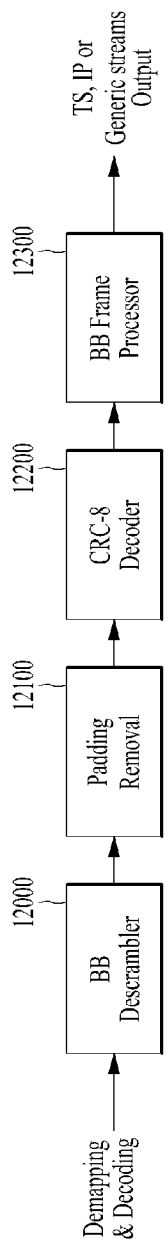
[Fig. 12]

[Fig. 13]
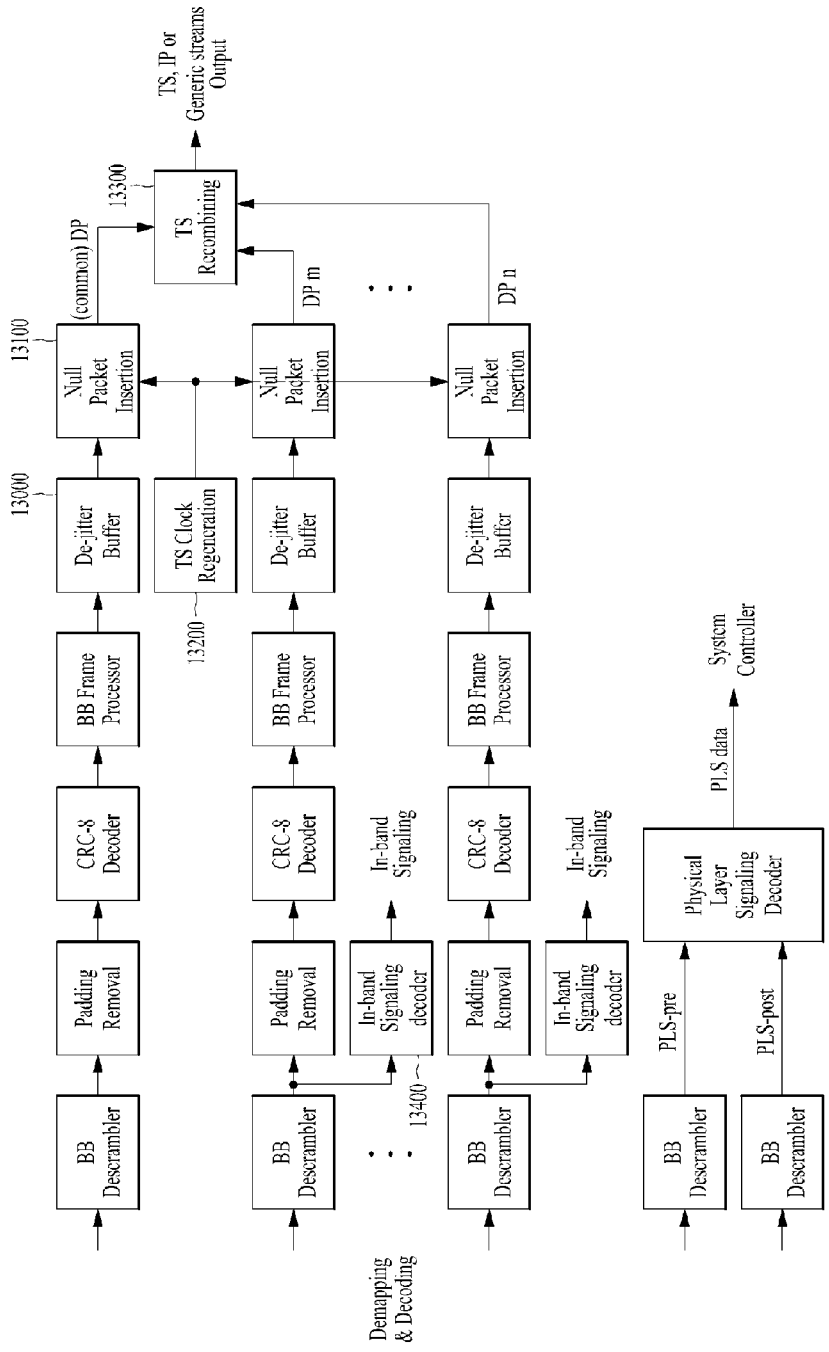

[Fig. 14]
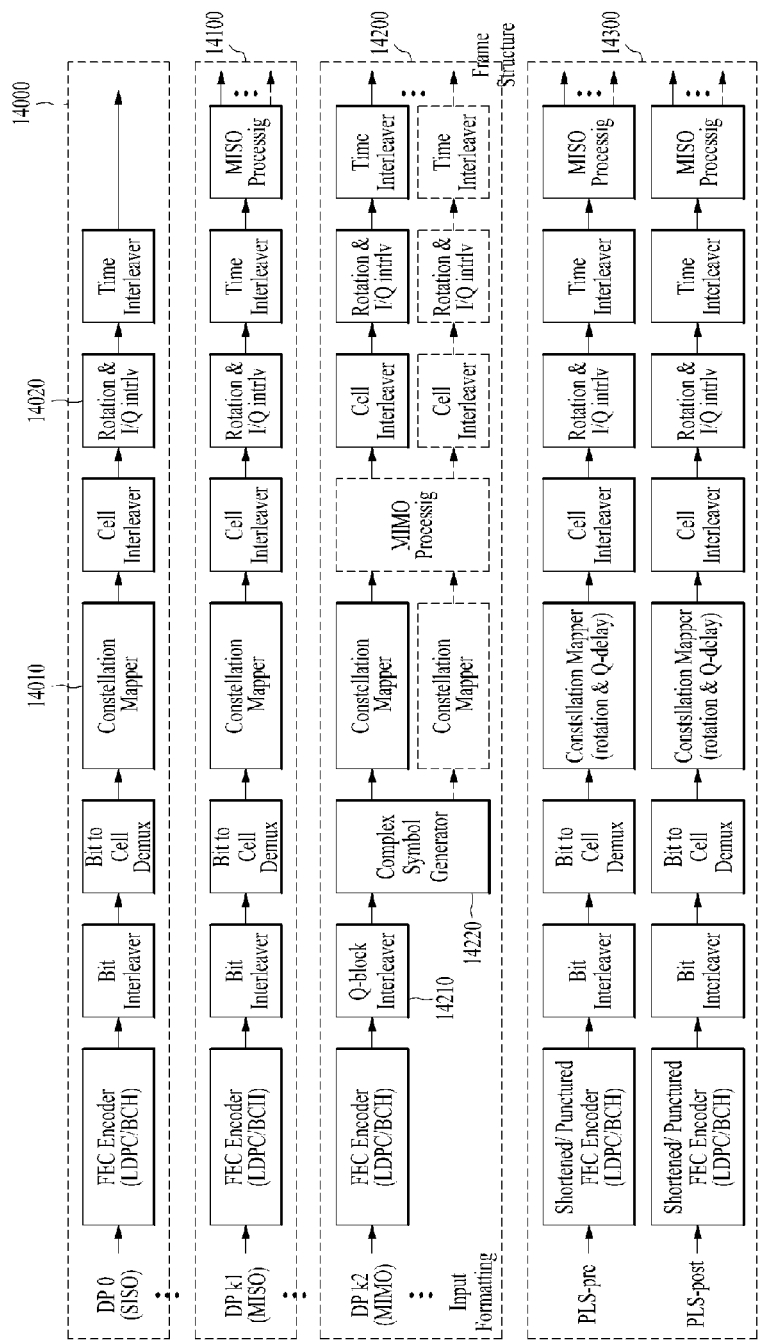

[Fig. 15]
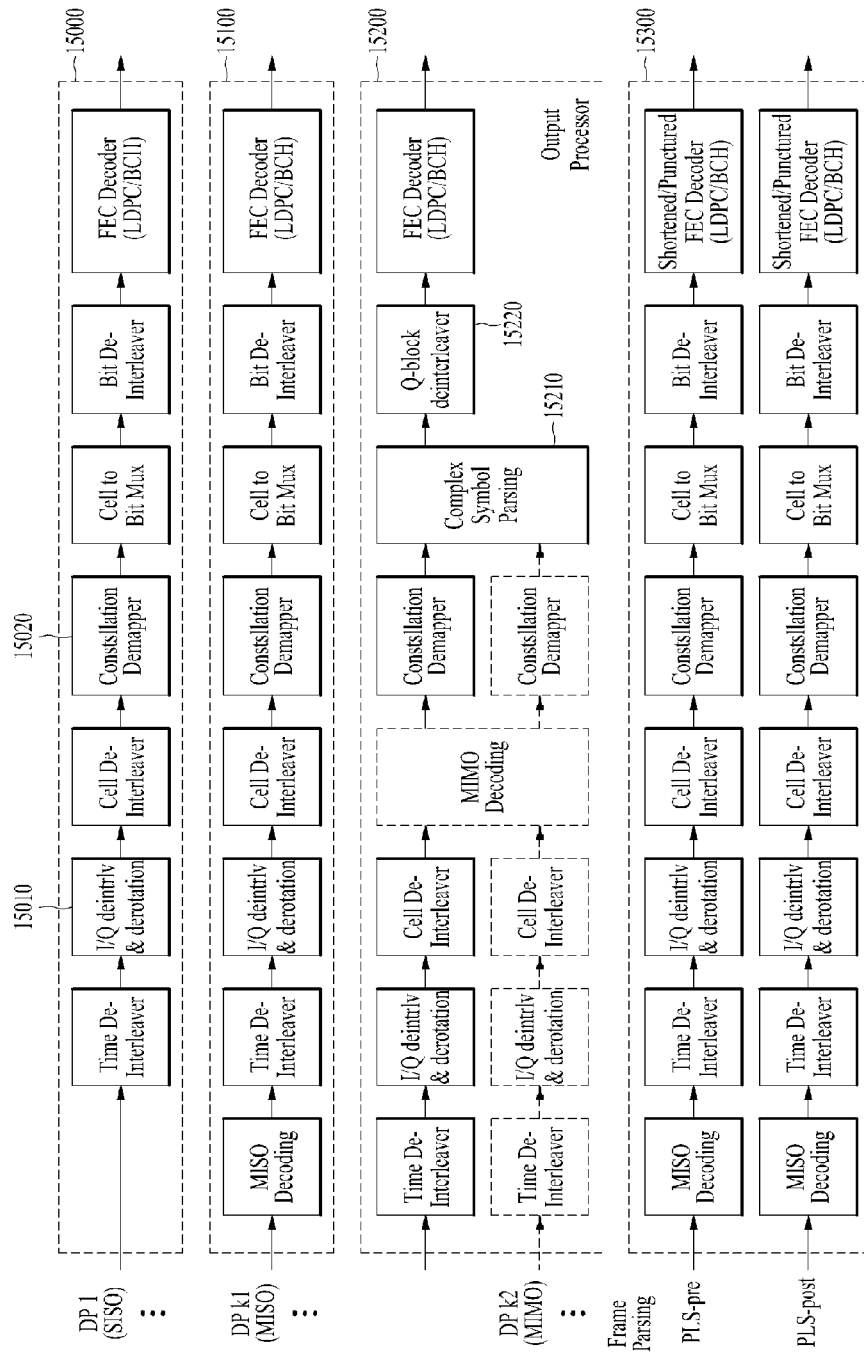

[Fig. 16]
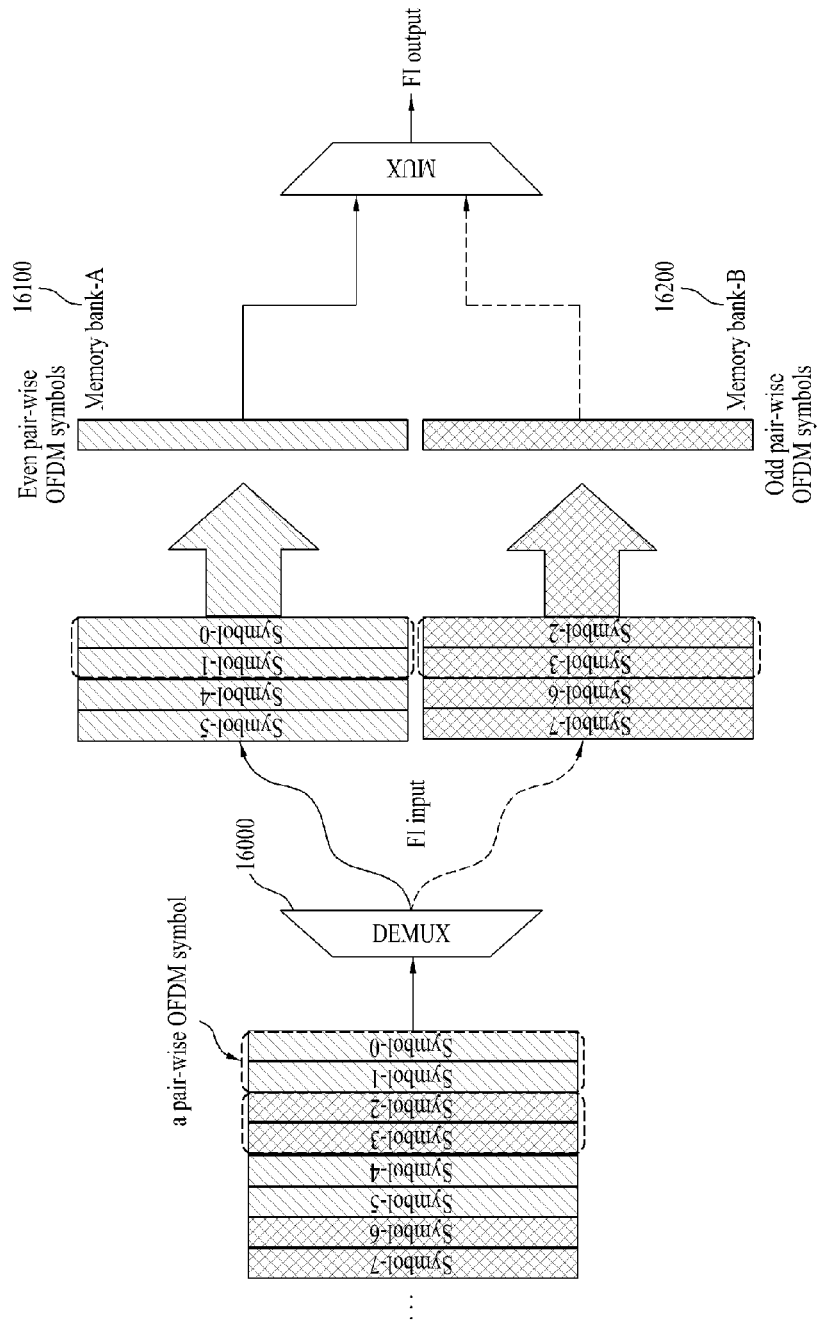

[Fig. 17]
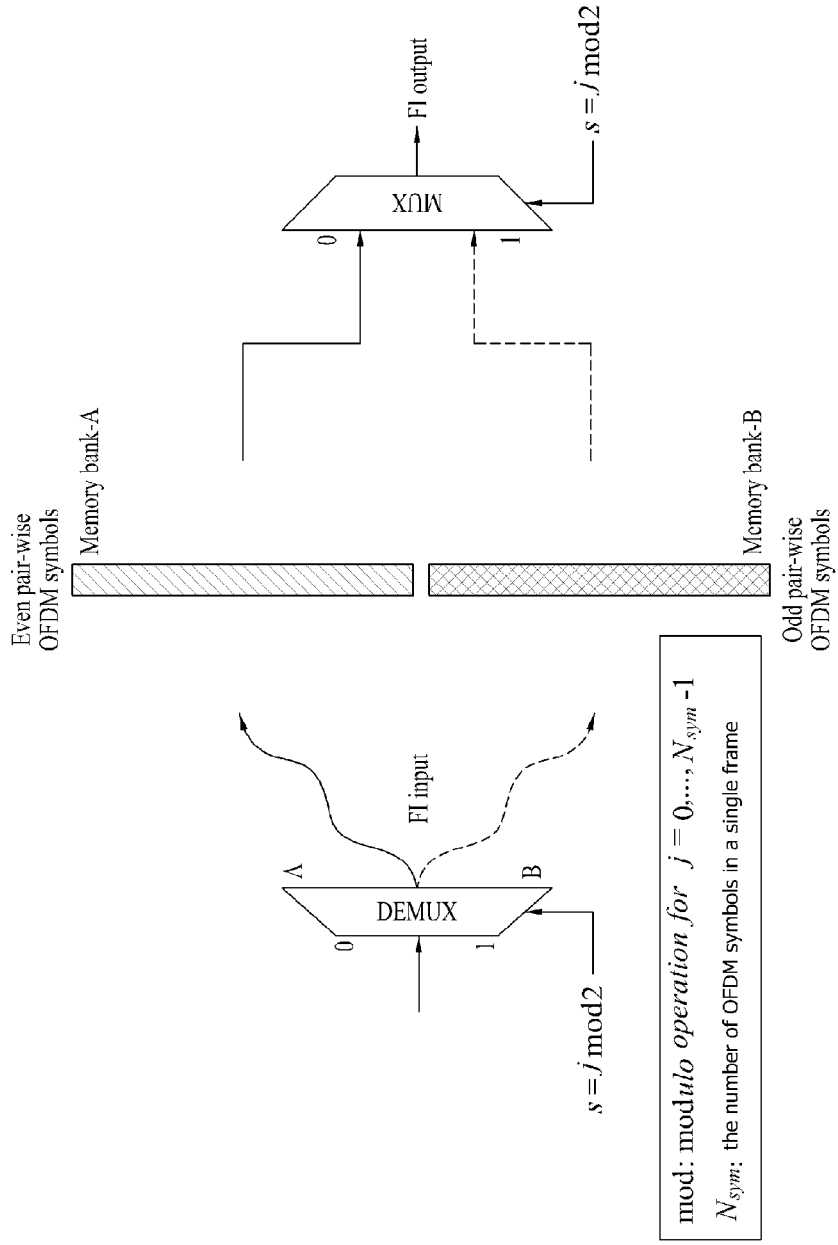

[Fig. 18]
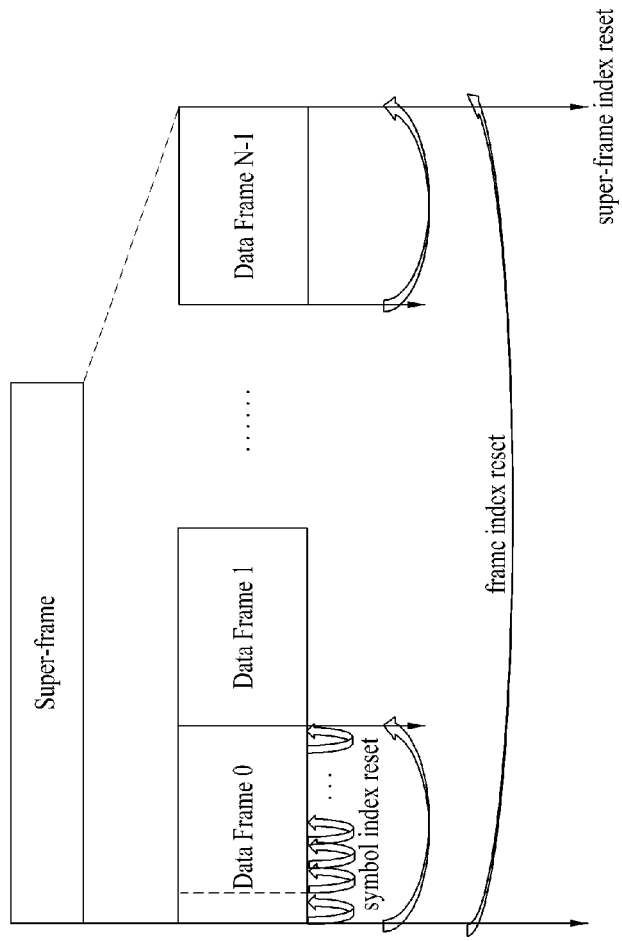

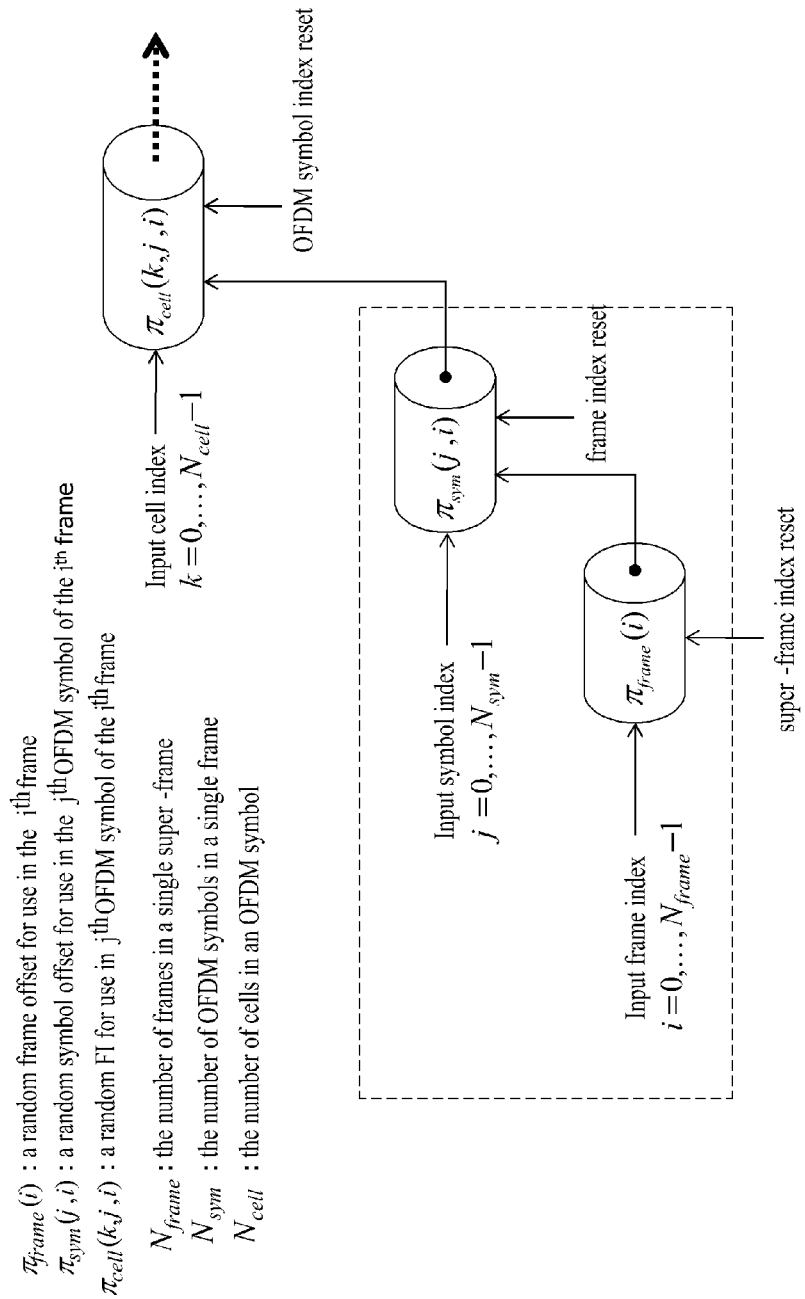
[Fig. 19]

[Fig. 20]
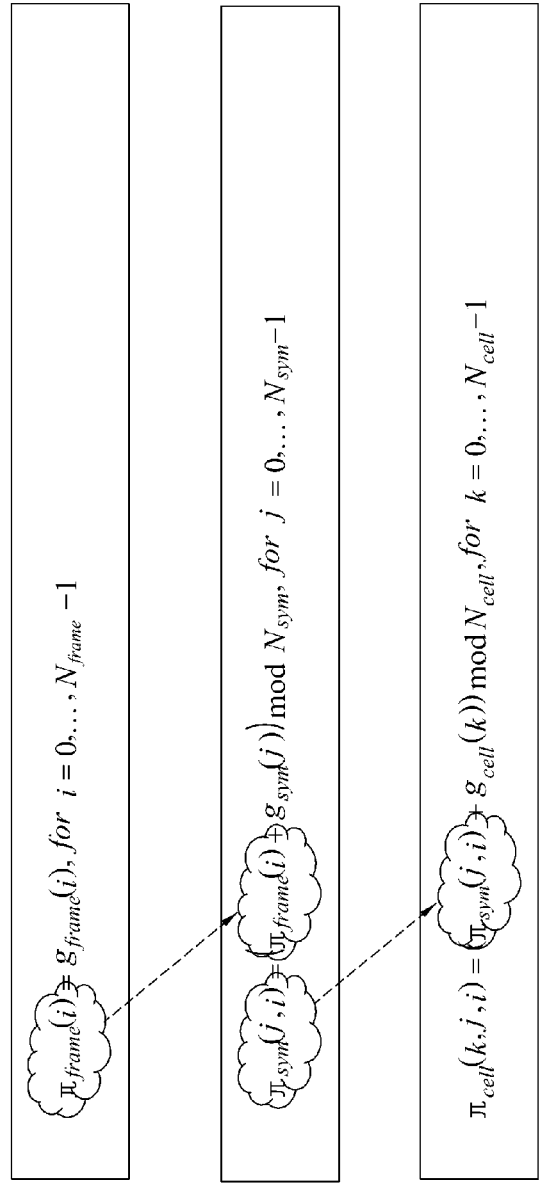

[Fig. 21]
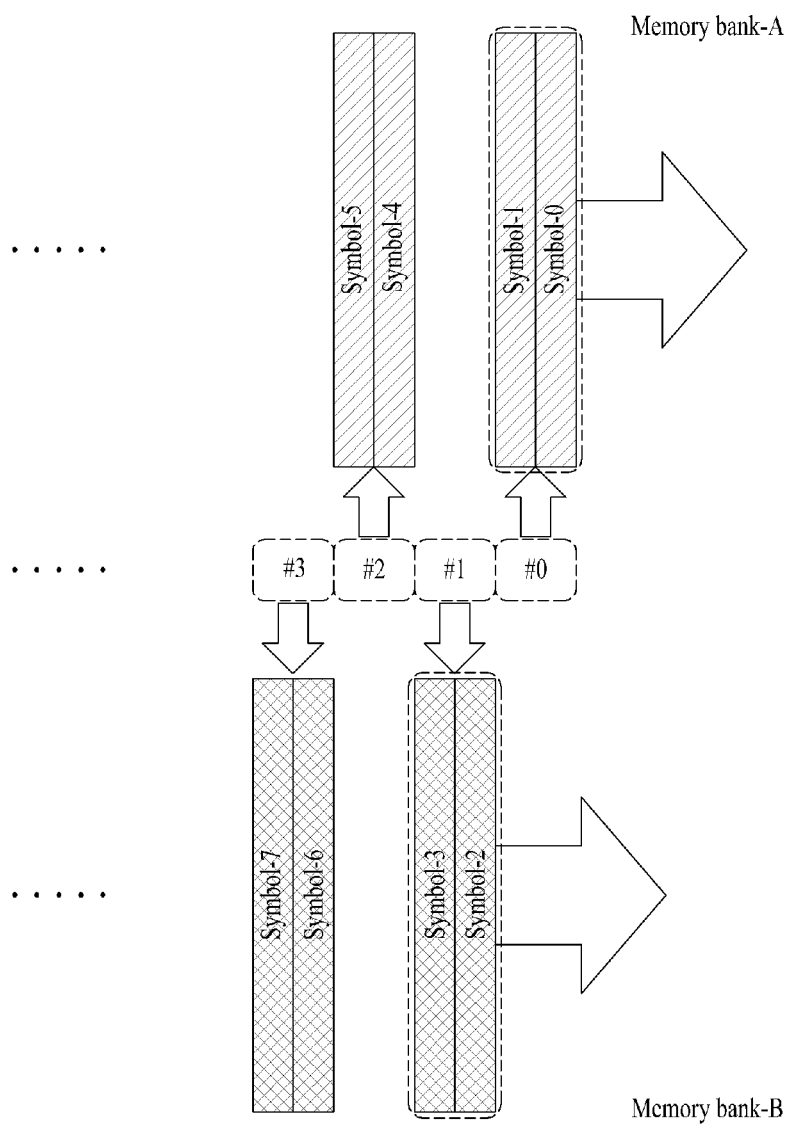

[Fig. 22]
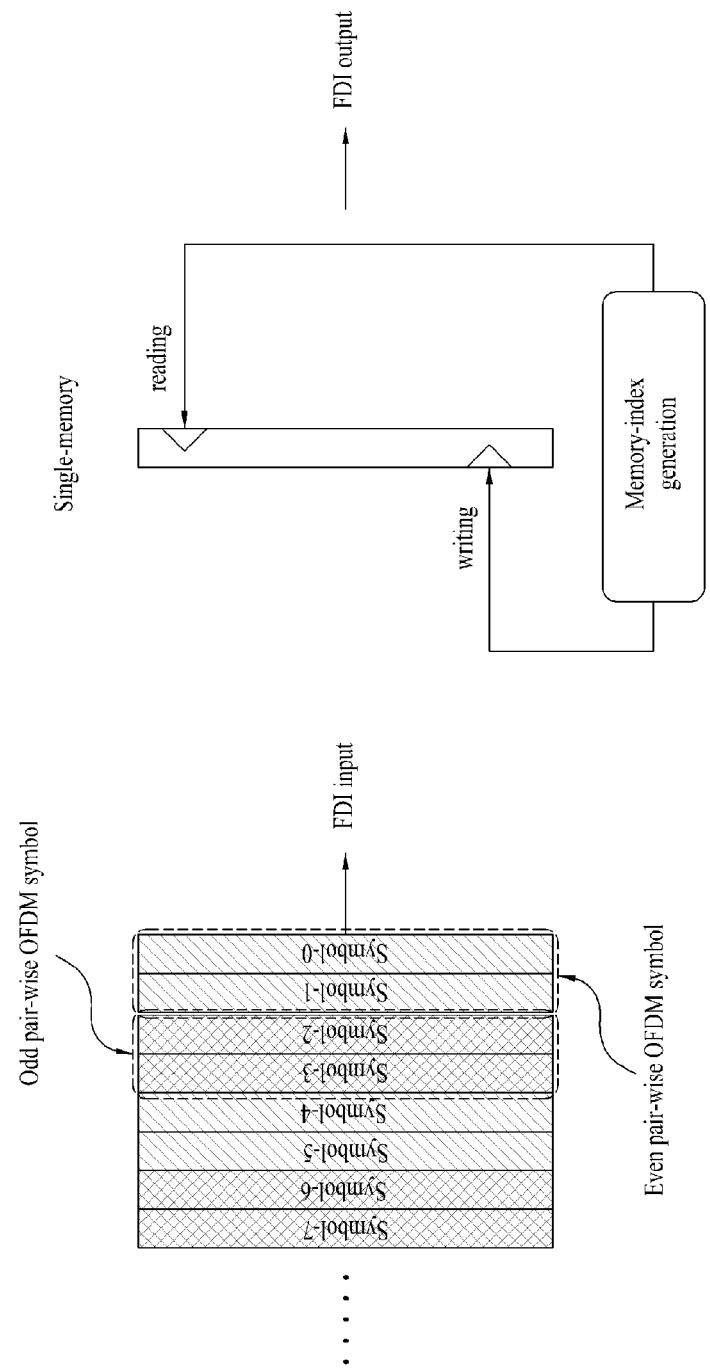

[Fig. 23]
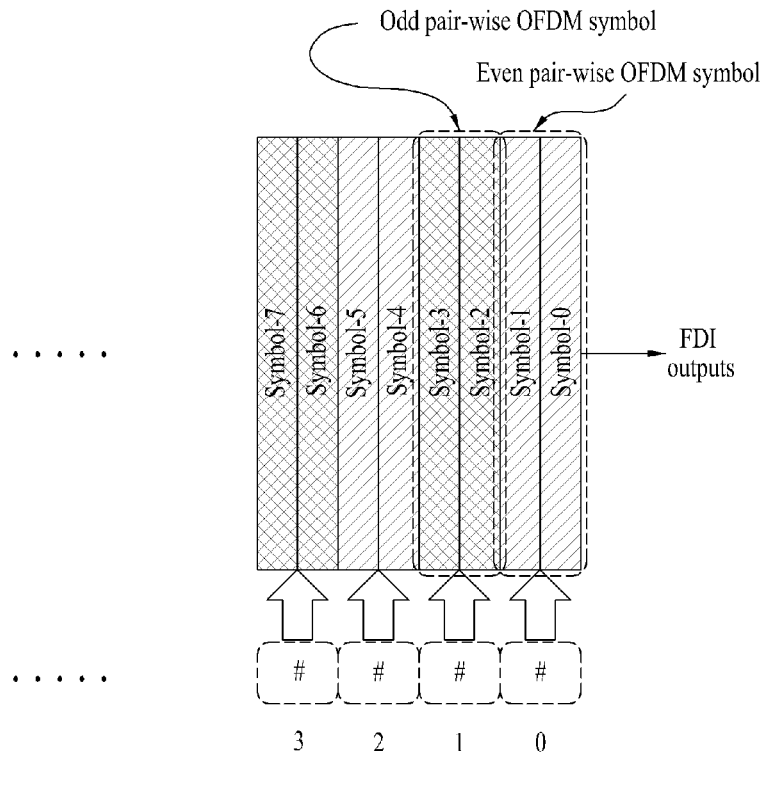
Deinterleaving seeds corresponding to interleaving seeds
[Fig. 24]
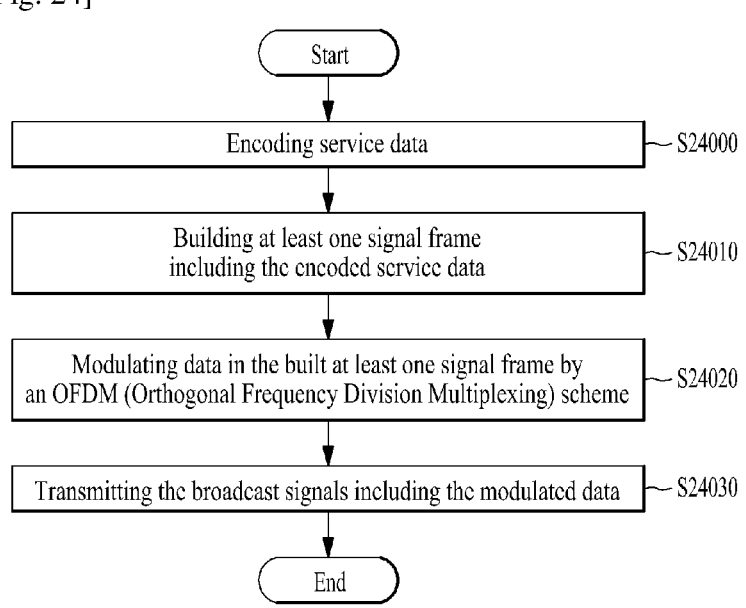

[Fig. 25]
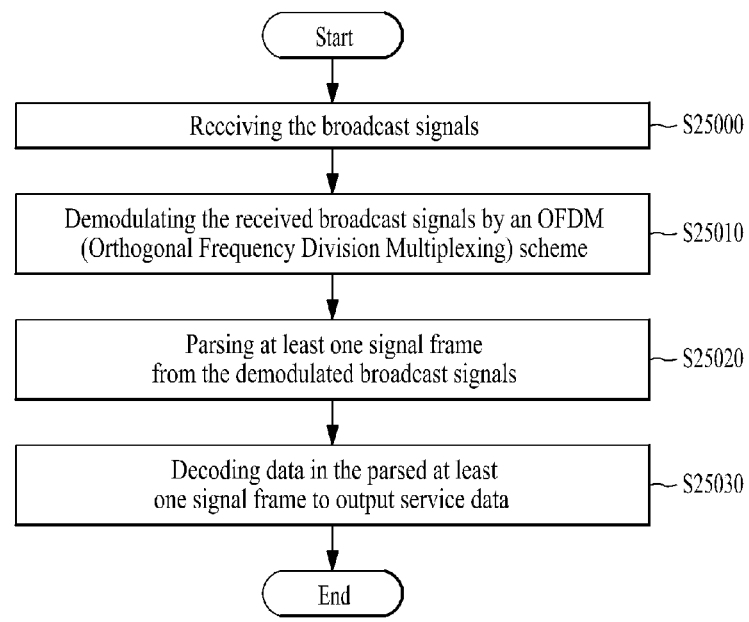

APPARATUS FOR TRANSMITTING BROADCAST SIGNALS, APPARATUS FOR RECEIVING BROADCAST SIGNALS, METHOD FOR TRANSMITTING BROADCAST SIGNALS AND METHOD FOR RECEIVING BROADCAST SIGNALS

CROSS REFERENCE TO RELATED APPLICATIONS

This application is the National Phase of PCT International Application No. PCT/KR2014/007586, filed on Aug. 14, 2014, which claims priority under 35 U.S.C. 119(e) to U.S. Provisional Application No. 61/865,626, filed on Aug. 14, 2013, and to U.S. Provisional Application No. 61/868,082, filed on Aug. 20, 2013, all of which are hereby expressly incorporated by reference into the present application.

TECHNICAL FIELD

The present invention relates to an apparatus for transmitting broadcast signals, an apparatus for receiving broadcast signals and methods for transmitting and receiving broadcast signals.

BACKGROUND ART

As analog broadcast signal transmission comes to an end, various technologies for transmitting/receiving digital broadcast signals are being developed. A digital broadcast signal may include a larger amount of video/audio data than an analog broadcast signal and further include various types of additional data in addition to the video/audio data.

DISCLOSURE OF INVENTION

Technical Problem

That is, a digital broadcast system can provide HD (high definition) images, multichannel audio and various additional services. However, data transmission efficiency for transmission of large amounts of data, robustness of transmission/reception networks and network flexibility in consideration of mobile reception equipment need to be improved for digital broadcast.

Solution to Problem

To achieve the object and other advantages and in accordance with the purpose of the invention, as embodied and broadly described herein, a method for transmitting broadcast signals comprises encoding service data, building at least one signal frame including the encoded service data, wherein the at least one signal frame includes a plurality of OFDM symbols, modulating data in the built at least one signal frame by an OFDM (Orthogonal Frequency Division Multiplex) scheme and transmitting the broadcast signals having the modulated data.

Advantageous Effects of Invention

The present invention can process data according to service characteristics to control QoS for each service or service component, thereby providing various broadcast services.

The present invention can achieve transmission flexibility by transmitting various broadcast services through the same RF signal bandwidth.

The present invention can improve data transmission efficiency and increase robustness of transmission/reception of broadcast signals using a MIMO system.

According to the present invention, it is possible to provide broadcast signal transmission and reception methods and apparatus capable of receiving digital broadcast signals without error even with mobile reception equipment or in an indoor environment.

BRIEF DESCRIPTION OF DRAWINGS

FIG. 1 illustrates a structure of an apparatus for transmitting broadcast signals for future broadcast services according to an embodiment of the present invention.

FIG. 2 illustrates an input formatting module according to an embodiment of the present invention.

FIG. 3 illustrates an input formatting module according to another embodiment of the present invention.

FIG. 4 illustrates an input formatting module according to another embodiment of the present invention.

FIG. 5 illustrates a coding & modulation module according to an embodiment of the present invention.

FIG. 6 illustrates a frame structure module according to an embodiment of the present invention.

FIG. 7 illustrates a waveform generation module according to an embodiment of the present invention.

FIG. 8 illustrates a structure of an apparatus for receiving broadcast signals for future broadcast services according to an embodiment of the present invention.

FIG. 9 illustrates a synchronization & demodulation module according to an embodiment of the present invention.

FIG. 10 illustrates a frame parsing module according to an embodiment of the present invention.

FIG. 11 illustrates a demapping & decoding module according to an embodiment of the present invention.

FIG. 12 illustrates an output processor according to an embodiment of the present invention.

FIG. 13 illustrates an output processor according to another embodiment of the present invention.

FIG. 14 illustrates a coding & modulation module according to another embodiment of the present invention.

FIG. 15 illustrates a demapping & decoding module according to another embodiment of the present invention.

FIG. 16 is a view illustrating an operation of a frequency interleaver according to an embodiment of the present invention.

FIG. 17 illustrates a basic switch model for MUX and DEMUX procedures according to an embodiment of the present invention.

FIG. 18 is a view illustrating a concept of frequency interleaving applied to a single super-frame according to an embodiment of the present invention.

FIG. 19 is a view illustrating logical operation mechanism of frequency interleaving applied to a single super-frame according to an embodiment of the present invention.

FIG. 20 illustrates math figures of logical operation mechanism of frequency interleaving applied to a single super-frame according to an embodiment of the present invention.

FIG. 21 illustrates an operation of a memory bank according to an embodiment of the present invention.

FIG. 22 illustrates a frequency deinterleaving procedure according to an embodiment of the present invention.

FIG. 23 is a view illustrating single-memory deinterleaving for input sequential OFDM symbols.

FIG. 24 is a flowchart illustrating a method for transmitting broadcast signals according to an embodiment of the present invention.

FIG. 25 is a flowchart illustrating a method for receiving broadcast signals according to an embodiment of the present invention.

BEST MODE FOR CARRYING OUT THE INVENTION

Reference will now be made in detail to the preferred embodiments of the present invention, examples of which are illustrated in the accompanying drawings. The detailed description, which will be given below with reference to the accompanying drawings, is intended to explain exemplary embodiments of the present invention, rather than to show the only embodiments that can be implemented according to the present invention. The following detailed description includes specific details in order to provide a thorough understanding of the present invention. However, it will be apparent to those skilled in the art that the present invention may be practiced without such specific details.

Although most terms used in the present invention have been selected from general ones widely used in the art, some terms have been arbitrarily selected by the applicant and their meanings are explained in detail in the following description as needed. Thus, the present invention should be understood based upon the intended meanings of the terms rather than their simple names or meanings.

The present invention provides apparatuses and methods for transmitting and receiving broadcast signals for future broadcast services. Future broadcast services according to an embodiment of the present invention include a terrestrial broadcast service, a mobile broadcast service, a UHDTV service, etc. The apparatuses and methods for transmitting according to an embodiment of the present invention may be categorized into a base profile for the terrestrial broadcast service, a handheld profile for the mobile broadcast service and an advanced profile for the UHDTV service. In this case, the base profile can be used as a profile for both the terrestrial broadcast service and the mobile broadcast service. That is, the base profile can be used to define a concept of a profile which includes the mobile profile. This can be changed according to intention of the designer.

The present invention may process broadcast signals for the future broadcast services through non-MIMO (Multiple Input Multiple Output) or MIMO according to one embodiment. A non-MIMO scheme according to an embodiment of the present invention may include a MISO (Multiple Input Single Output) scheme, a SISO (Single Input Single Output) scheme, etc.

While MISO or MIMO uses two antennas in the following for convenience of description, the present invention is applicable to systems using two or more antennas.

FIG. 1 illustrates a structure of an apparatus for transmitting broadcast signals for future broadcast services according to an embodiment of the present invention.

The apparatus for transmitting broadcast signals for future broadcast services according to an embodiment of the present invention can include an input formatting module 1000, a coding & modulation module 1100, a frame structure module 1200, a waveform generation module 1300 and a signaling generation module 1400. A description will be given of the operation of each module of the apparatus for transmitting broadcast signals.

Referring to FIG. 1, the apparatus for transmitting broadcast signals for future broadcast services according to an embodiment of the present invention can receive MPEG-TSs, IP streams (v4/v6) and generic streams (GSs) as an input signal. In addition, the apparatus for transmitting broadcast signals can receive management information about the configuration of each stream constituting the input signal and generate a final physical layer signal with reference to the received management information.

The input formatting module 1000 according to an embodiment of the present invention can classify the input streams on the basis of a standard for coding and modulation or services or service components and output the input streams as a plurality of logical data pipes (or data pipes or DP data). The data pipe is a logical channel in the physical layer that carries service data or related metadata, which may carry one or multiple service(s) or service component (s). In addition, data transmitted through each data pipe may be called DP data.

*In addition, the input formatting module 1000 according to an embodiment of the present invention can divide each data pipe into blocks necessary to perform coding and modulation and carry out processes necessary to increase transmission efficiency or to perform scheduling. Details of operations of the input formatting module 1000 will be described later.

The coding & modulation module 1100 according to an embodiment of the present invention can perform forward error correction (FEC) encoding on each data pipe received from the input formatting module 1000 such that an apparatus for receiving broadcast signals can correct an error that may be generated on a transmission channel. In addition, the coding & modulation module 1100 according to an embodiment of the present invention can convert FEC output bit data to symbol data and interleave the symbol data to correct burst error caused by a channel. As shown in FIG. 1, the coding & modulation module 1100 according to an embodiment of the present invention can divide the processed data such that the divided data can be output through data paths for respective antenna outputs in order to transmit the data through two or more Tx antennas.

The frame structure module 1200 according to an embodiment of the present invention can map the data output from the coding & modulation module 1100 to signal frames. The frame structure module 1200 according to an embodiment of the present invention can perform mapping using scheduling information output from the input formatting module 1000 and interleave data in the signal frames in order to obtain additional diversity gain.

The waveform generation module 1300 according to an embodiment of the present invention can convert the signal frames output from the frame structure module 1200 into a signal for transmission. In this case, the waveform generation module 1300 according to an embodiment of the present invention can insert a preamble signal (or preamble) into the signal for detection of the transmission apparatus and insert a reference signal for estimating a transmission channel to compensate for distortion into the signal. In addition, the waveform generation module 1300 according to an embodiment of the present invention can provide a guard interval and insert a specific sequence into the same in order to offset the influence of channel delay spread due to multi-path reception. Additionally, the waveform generation module 1300 according to an embodiment of the present invention can perform a procedure necessary for efficient transmission in consideration of signal characteristics such as a peak-to-average power ratio of the output signal.

The signaling generation module 1400 according to an embodiment of the present invention generates final physical layer signaling information using the input management information and information generated by the input formatting module 1000, coding & modulation module 1100 and frame structure module 1200. Accordingly, a reception apparatus according to an embodiment of the present invention can decode a received signal by decoding the signaling information.

As described above, the apparatus for transmitting broadcast signals for future broadcast services according to one embodiment of the present invention can provide terrestrial broadcast service, mobile broadcast service, UHDTV service, etc. Accordingly, the apparatus for transmitting broadcast signals for future broadcast services according to one embodiment of the present invention can multiplex signals for different services in the time domain and transmit the same.

FIGS. 2, 3 and 4 illustrate the input formatting module 1000 according to embodiments of the present invention. A description will be given of each figure.

FIG. 2 illustrates an input formatting module according to one embodiment of the present invention. FIG. 2 shows an input formatting module when the input signal is a single input stream.

Referring to FIG. 2, the input formatting module according to one embodiment of the present invention can include a mode adaptation module 2000 and a stream adaptation module 2100.

As shown in FIG. 2, the mode adaptation module 2000 can include an input interface block 2010, a CRC-8 encoder block 2020 and a BB header insertion block 2030. Description will be given of each block of the mode adaptation module 2000.

The input interface block 2010 can divide the single input stream input thereto into data pieces each having the length of a baseband (BB) frame used for FEC (BCH/LDPC) which will be performed later and output the data pieces.

The CRC-8 encoder block 2020 can perform CRC encoding on BB frame data to add redundancy data thereto.

The BB header insertion block 2030 can insert, into the BB frame data, a header including information such as mode adaptation type (TS/GS/IP), a user packet length, a data field length, user packet sync byte, start address of user packet sync byte in data field, a high efficiency mode indicator, an input stream synchronization field, etc.

As shown in FIG. 2, the stream adaptation module 2100 can include a padding insertion block 2110 and a BB scrambler block 2120. Description will be given of each block of the stream adaptation module 2100.

If data received from the mode adaptation module 2000 has a length shorter than an input data length necessary for FEC encoding, the padding insertion block 2110 can insert a padding bit into the data such that the data has the input data length and output the data including the padding bit.

The BB scrambler block 2120 can randomize the input bit stream by performing an XOR operation on the input bit stream and a pseudo random binary sequence (PRBS).

The above-described blocks may be omitted or replaced by blocks having similar or identical functions.

As shown in FIG. 2, the input formatting module can finally output data pipes to the coding & modulation module.

FIG. 3 illustrates an input formatting module according to another embodiment of the present invention. FIG. 3 shows a mode adaptation module 3000 of the input formatting module when the input signal corresponds to multiple input streams.

The mode adaptation module 3000 of the input formatting module for processing the multiple input streams can independently process the multiple input streams.

Referring to FIG. 3, the mode adaptation module 3000 for respectively processing the multiple input streams can include input interface blocks, input stream synchronizer blocks 3100, compensating delay blocks 3200, null packet deletion blocks 3300, CRC-8 encoder blocks and BB header insertion blocks. Description will be given of each block of the mode adaptation module 3000.

Operations of the input interface block, CRC-8 encoder block and BB header insertion block correspond to those of the input interface block, CRC-8 encoder block and BB header insertion block described with reference to FIG. 2 and thus description thereof is omitted.

The input stream synchronizer block 3100 can transmit input stream clock reference (ISCR) information to generate timing information necessary for the apparatus for receiving broadcast signals to restore the TSs or GSs.

The compensating delay block 3200 can delay input data and output the delayed input data such that the apparatus for receiving broadcast signals can synchronize the input data if a delay is generated between data pipes according to processing of data including the timing information by the transmission apparatus.

The null packet deletion block 3300 can delete unnecessarily transmitted input null packets from the input data, insert the number of deleted null packets into the input data based on positions in which the null packets are deleted and transmit the input data.

The above-described blocks may be omitted or replaced by blocks having similar or identical functions.

FIG. 4 illustrates an input formatting module according to another embodiment of the present invention.

Specifically, FIG. 4 illustrates a stream adaptation module of the input formatting module when the input signal corresponds to multiple input streams.

The stream adaptation module of the input formatting module when the input signal corresponds to multiple input streams can include a scheduler 4000, a 1-frame delay block 4100, an in-band signaling or padding insertion block 4200, a physical layer signaling generation block 4300 and a BB scrambler block 4400. Description will be given of each block of the stream adaptation module.

The scheduler 4000 can perform scheduling for a MIMO system using multiple antennas having dual polarity. In addition, the scheduler 4000 can generate parameters for use in signal processing blocks for antenna paths, such as a bit-to-cell demux block, a cell interleaver block, a time interleaver block, etc. included in the coding & modulation module illustrated in FIG. 1.

The 1-frame delay block 4100 can delay the input data by one transmission frame such that scheduling information about the next frame can be transmitted through the current frame for in-band signaling information to be inserted into the data pipes.

The in-band signaling or padding insertion block 4200 can insert undelayed physical layer signaling (PLS)-dynamic signaling information into the data delayed by one transmission frame. In this case, the in-band signaling or padding insertion block 4200 can insert a padding bit when a space for padding is present or insert in-band signaling information into the padding space. In addition, the scheduler 4000 can output physical layer signaling-dynamic signaling information about the current frame separately from in-band signaling information. Accordingly, a cell mapper, which will be described later, can map input cells according to scheduling information output from the scheduler 4000.

The physical layer signaling generation block 4300 can generate physical layer signaling data which will be transmitted through a preamble symbol of a transmission frame or spread and transmitted through a data symbol other than the in-band signaling information. In this case, the physical layer signaling data according to an embodiment of the present invention can be referred to as signaling information. Furthermore, the physical layer signaling data according to an embodiment of the present invention can be divided into PLS-pre information and PLS-post information. The PLS-pre information can include parameters necessary to encode the PLS-post information and static PLS signaling data and the PLS-post information can include parameters necessary to encode the data pipes. The parameters necessary to encode the data pipes can be classified into static PLS signaling data and dynamic PLS signaling data. The static PLS signaling data is a parameter commonly applicable to all frames included in a super-frame and can be changed on a super-frame basis. The dynamic PLS signaling data is a parameter differently applicable to respective frames included in a super-frame and can be changed on a frame-by-frame basis. Accordingly, the reception apparatus can acquire the PLS-post information by decoding the PLS-pre information and decode desired data pipes by decoding the PLS-post information.

The BB scrambler block 4400 can generate a pseudo-random binary sequence (PRBS) and perform an XOR operation on the PRBS and the input bit streams to decrease the peak-to-average power ratio (PAPR) of the output signal of the waveform generation block. As shown in FIG. 4, scrambling of the BB scrambler block 4400 is applicable to both data pipes and physical layer signaling information.

The above-described blocks may be omitted or replaced by blocks having similar or identical functions according to designer.

As shown in FIG. 4, the stream adaptation module can finally output the data pipes to the coding & modulation module.

FIG. 5 illustrates a coding & modulation module according to an embodiment of the present invention.

The coding & modulation module shown in FIG. 5 corresponds to an embodiment of the coding & modulation module illustrated in FIG. 1.

As described above, the apparatus for transmitting broadcast signals for future broadcast services according to an embodiment of the present invention can provide a terrestrial broadcast service, mobile broadcast service, UHDTV service, etc.

Since QoS (quality of service) depends on characteristics of a service provided by the apparatus for transmitting broadcast signals for future broadcast services according to an embodiment of the present invention, data corresponding to respective services needs to be processed through different schemes. Accordingly, the coding & modulation module according to an embodiment of the present invention can independently process data pipes input thereto by independently applying SISO, MISO and MIMO schemes to the data pipes respectively corresponding to data paths. Consequently, the apparatus for transmitting broadcast signals for future broadcast services according to an embodiment of the present invention can control QoS for each service or service component transmitted through each data pipe.

Accordingly, the coding & modulation module according to an embodiment of the present invention can include a first block 5000 for SISO, a second block 5100 for MISO, a third block 5200 for MIMO and a fourth block 5300 for processing the PLS-pre/PLS-post information. The coding & modulation module illustrated in FIG. 5 is an exemplary and may include only the first block 5000 and the fourth block 5300, the second block 5100 and the fourth block 5300 or the third block 5200 and the fourth block 5300 according to design. That is, the coding & modulation module can include blocks for processing data pipes equally or differently according to design.

A description will be given of each block of the coding & modulation module.

The first block 5000 processes an input data pipe according to SISO and can include an FEC encoder block 5010, a bit interleaver block 5020, a bit-to-cell demux block 5030, a constellation mapper block 5040, a cell interleaver block 5050 and a time interleaver block 5060.

The FEC encoder block 5010 can perform BCH encoding and LDPC encoding on the input data pipe to add redundancy thereto such that the reception apparatus can correct an error generated on a transmission channel.

The bit interleaver block 5020 can interleave bit streams of the FEC-encoded data pipe according to an interleaving rule such that the bit streams have robustness against burst error that may be generated on the transmission channel. Accordingly, when deep fading or erasure is applied to QAM symbols, errors can be prevented from being generated in consecutive bits from among all codeword bits since interleaved bits are mapped to the QAM symbols.

The bit-to-cell demux block 5030 can determine the order of input bit streams such that each bit in an FEC block can be transmitted with appropriate robustness in consideration of both the order of input bit streams and a constellation mapping rule.

In addition, the bit interleaver block 5020 is located between the FEC encoder block 5010 and the constellation mapper block 5040 and can connect output bits of LDPC encoding performed by the FEC encoder block 5010 to bit positions having different reliability values and optimal values of the constellation mapper in consideration of LDPC decoding of the apparatus for receiving broadcast signals. Accordingly, the bit-to-cell demux block 5030 can be replaced by a block having a similar or equal function.

The constellation mapper block 5040 can map a bit word input thereto to one constellation. In this case, the constellation mapper block 5040 can additionally perform rotation & Q-delay. That is, the constellation mapper block 5040 can rotate input constellations according to a rotation angle, divide the constellations into an in-phase component and a quadrature-phase component and delay only the quadrature-phase component by an arbitrary value. Then, the constellation mapper block 5040 can remap the constellations to new constellations using a paired in-phase component and quadrature-phase component.

In addition, the constellation mapper block 5040 can move constellation points on a two-dimensional plane in order to find optimal constellation points. Through this process, capacity of the coding & modulation module 1100 can be optimized. Furthermore, the constellation mapper block 5040 can perform the above-described operation using IQ-balanced constellation points and rotation. The constellation mapper block 5040 can be replaced by a block having a similar or equal function.

The cell interleaver block 5050 can randomly interleave cells corresponding to one FEC block and output the interleaved cells such that cells corresponding to respective FEC blocks can be output in different orders.

The time interleaver block 5060 can interleave cells belonging to a plurality of FEC blocks and output the interleaved cells. Accordingly, the cells corresponding to the FEC blocks are dispersed and transmitted in a period corresponding to a time interleaving depth and thus diversity gain can be obtained.

The second block 5100 processes an input data pipe according to MISO and can include the FEC encoder block, bit interleaver block, bit-to-cell demux block, constellation mapper block, cell interleaver block and time interleaver block in the same manner as the first block 5000. However, the second block 5100 is distinguished from the first block 5000 in that the second block 5100 further includes a MISO processing block 5110. The second block 5100 performs the same procedure including the input operation to the time interleaver operation as those of the first block 5000 and thus description of the corresponding blocks is omitted.

The MISO processing block 5110 can encode input cells according to a MISO encoding matrix providing transmit diversity and output MISO-processed data through two paths. MISO processing according to one embodiment of the present invention can include OSTBC (orthogonal space time block coding)/OSFBC (orthogonal space frequency block coding, Alamouti coding).

The third block 5200 processes an input data pipe according to MIMO and can include the FEC encoder block, bit interleaver block, bit-to-cell demux block, constellation mapper block, cell interleaver block and time interleaver block in the same manner as the second block 5100, as shown in FIG. 5. However, the data processing procedure of the third block 5200 is different from that of the second block 5100 since the third block 5200 includes a MIMO processing block 5220.

That is, in the third block 5200, basic roles of the FEC encoder block and the bit interleaver block are identical to those of the first and second blocks 5000 and 5100 although functions thereof may be different from those of the first and second blocks 5000 and 5100.

The bit-to-cell demux block 5210 can generate as many output bit streams as input bit streams of MIMO processing and output the output bit streams through MIMO paths for MIMO processing. In this case, the bit-to-cell demux block 5210 can be designed to optimize the decoding performance of the reception apparatus in consideration of characteristics of LDPC and MIMO processing.

Basic roles of the constellation mapper block, cell interleaver block and time interleaver block are identical to those of the first and second blocks 5000 and 5100 although functions thereof may be different from those of the first and second blocks 5000 and 5100. As shown in FIG. 5, as many constellation mapper blocks, cell interleaver blocks and time interleaver blocks as the number of MIMO paths for MIMO processing can be present. In this case, the constellation mapper blocks, cell interleaver blocks and time interleaver blocks can operate equally or independently for data input through the respective paths.

The MIMO processing block 5220 can perform MIMO processing on two input cells using a MIMO encoding matrix and output the MIMO-processed data through two paths. The MIMO encoding matrix according to an embodiment of the present invention can include spatial multiplexing, Golden code, full-rate full diversity code, linear dispersion code, etc.

The fourth block 5300 processes the PLS-pre/PLS-post information and can perform SISO or MISO processing.

The basic roles of the bit interleaver block, bit-to-cell demux block, constellation mapper block, cell interleaver block, time interleaver block and MISO processing block included in the fourth block 5300 correspond to those of the second block 5100 although functions thereof may be different from those of the second block 5100.

A shortened/punctured FEC encoder block 5310 included in the fourth block 5300 can process PLS data using an FEC encoding scheme for a PLS path provided for a case in which the length of input data is shorter than a length necessary to perform FEC encoding. Specifically, the shortened/punctured FEC encoder block 5310 can perform BCH encoding on input bit streams, pad 0s corresponding to a desired input bit stream length necessary for normal LDPC encoding, carry out LDPC encoding and then remove the padded 0s to puncture parity bits such that an effective code rate becomes equal to or lower than the data pipe rate.

The blocks included in the first block 5000 to fourth block 5300 may be omitted or replaced by blocks having similar or identical functions according to design.

As illustrated in FIG. 5, the coding & modulation module can output the data pipes (or DP data), PLS-pre information and PLS-post information processed for the respective paths to the frame structure module.

*FIG. 6 illustrates a frame structure module according to one embodiment of the present invention.

The frame structure module shown in FIG. 6 corresponds to an embodiment of the frame structure module 1200 illustrated in FIG. 1.

The frame structure module according to one embodiment of the present invention can include at least one cell-mapper 6000, at least one delay compensation module 6100 and at least one block interleaver 6200. The number of cell mappers 6000, delay compensation modules 6100 and block interleavers 6200 can be changed. A description will be given of each module of the frame structure block.

The cell-mapper 6000 can allocate cells corresponding to SISO-, MISO- or MIMO-processed data pipes output from the coding & modulation module, cells corresponding to common data commonly applicable to the data pipes and cells corresponding to the PLS-pre/PLS-post information to signal frames according to scheduling information. The common data refers to signaling information commonly applied to all or some data pipes and can be transmitted through a specific data pipe. The data pipe through which the common data is transmitted can be referred to as a common data pipe and can be changed according to design.

When the apparatus for transmitting broadcast signals according to an embodiment of the present invention uses two output antennas and Alamouti coding is used for MISO processing, the cell-mapper 6000 can perform pair-wise cell mapping in order to maintain orthogonality according to Alamouti encoding. That is, the cell-mapper 6000 can process two consecutive cells of the input cells as one unit and map the unit to a frame. Accordingly, paired cells in an input path corresponding to an output path of each antenna can be allocated to neighboring positions in a transmission frame.

The delay compensation block 6100 can obtain PLS data corresponding to the current transmission frame by delaying input PLS data cells for the next transmission frame by one frame. In this case, the PLS data corresponding to the current frame can be transmitted through a preamble part in the current signal frame and PLS data corresponding to the next signal frame can be transmitted through a preamble part in the current signal frame or in-band signaling in each data pipe of the current signal frame. This can be changed by the designer.

The block interleaver 6200 can obtain additional diversity gain by interleaving cells in a transport block corresponding to the unit of a signal frame. In addition, the block interleaver 6200 can perform interleaving by processing two consecutive cells of the input cells as one unit when the above-described pair-wise cell mapping is performed. Accordingly, cells output from the block interleaver 6200 can be two consecutive identical cells.

When pair-wise mapping and pair-wise interleaving are performed, at least one cell mapper and at least one block interleaver can operate equally or independently for data input through the paths.

The above-described blocks may be omitted or replaced by blocks having similar or identical functions according to design.

As illustrated in FIG. 6, the frame structure module can output at least one signal frame to the waveform generation module.

FIG. 7 illustrates a waveform generation module according to an embodiment of the present invention.

The waveform generation module illustrated in FIG. 7 corresponds to an embodiment of the waveform generation module 1300 described with reference to FIG. 1.

The waveform generation module according to an embodiment of the present invention can modulate and transmit as many signal frames as the number of antennas for receiving and outputting signal frames output from the frame structure module illustrated in FIG. 6.

Specifically, the waveform generation module illustrated in FIG. 7 is an embodiment of a waveform generation module of an apparatus for transmitting broadcast signals using m Tx antennas and can include m processing blocks for modulating and outputting frames corresponding to m paths. The m processing blocks can perform the same processing procedure. A description will be given of operation of the first processing block 7000 from among the m processing blocks.

The first processing block 7000 can include a reference signal & PAPR reduction block 7100, an inverse waveform transform block 7200, a PAPR reduction in time block 7300, a guard sequence insertion block 7400, a preamble insertion block 7500, a waveform processing block 7600, other system insertion block 7700 and a DAC (digital analog converter) block 7800.

The reference signal insertion & PAPR reduction block 7100 can insert a reference signal into a predetermined position of each signal block and apply a PAPR reduction scheme to reduce a PAPR in the time domain. If a broadcast transmission/reception system according to an embodiment of the present invention corresponds to an OFDM system, the reference signal insertion & PAPR reduction block 7100 can use a method of reserving some active subcarriers rather than using the same. In addition, the reference signal insertion & PAPR reduction block 7100 may not use the PAPR reduction scheme as an optional feature according to broadcast transmission/reception system.

The inverse waveform transform block 7200 can transform an input signal in a manner of improving transmission efficiency and flexibility in consideration of transmission channel characteristics and system architecture. If the broadcast transmission/reception system according to an embodiment of the present invention corresponds to an OFDM system, the inverse waveform transform block 7200 can employ a method of transforming a frequency domain signal into a time domain signal through inverse FFT operation. If the broadcast transmission/reception system according to an embodiment of the present invention corresponds to a single carrier system, the inverse waveform transform block 7200 may not be used in the waveform generation module.

The PAPR reduction in time block 7300 can use a method for reducing PAPR of an input signal in the time domain. If the broadcast transmission/reception system according to an embodiment of the present invention corresponds to an OFDM system, the PAPR reduction in time block 7300 may use a method of simply clipping peak amplitude. Furthermore, the PAPR reduction in time block 7300 may not be used in the broadcast transmission/reception system according to an embodiment of the present invention since it is an optional feature.

The guard sequence insertion block 7400 can provide a guard interval between neighboring signal blocks and insert a specific sequence into the guard interval as necessary in order to minimize the influence of delay spread of a transmission channel. Accordingly, the reception apparatus can easily perform synchronization or channel estimation. If the broadcast transmission/reception system according to an embodiment of the present invention corresponds to an OFDM system, the guard sequence insertion block 7400 may insert a cyclic prefix into a guard interval of an OFDM symbol.

The preamble insertion block 7500 can insert a signal of a known type (e.g. the preamble or preamble symbol) agreed upon between the transmission apparatus and the reception apparatus into a transmission signal such that the reception apparatus can rapidly and efficiently detect a target system signal. If the broadcast transmission/reception system according to an embodiment of the present invention corresponds to an OFDM system, the preamble insertion block 7500 can define a signal frame composed of a plurality of OFDM symbols and insert a preamble symbol into the beginning of each signal frame. That is, the preamble carries basic PLS data and is located in the beginning of a signal frame.

The waveform processing block 7600 can perform waveform processing on an input baseband signal such that the input baseband signal meets channel transmission characteristics. The waveform processing block 7600 may use a method of performing square-root-raised cosine (SRRC) filtering to obtain a standard for out-of-band emission of a transmission signal. If the broadcast transmission/reception system according to an embodiment of the present invention corresponds to a multi-carrier system, the waveform processing block 7600 may not be used.

The other system insertion block 7700 can multiplex signals of a plurality of broadcast transmission/reception systems in the time domain such that data of two or more different broadcast transmission/reception systems providing broadcast services can be simultaneously transmitted in the same RF signal bandwidth. In this case, the two or more different broadcast transmission/reception systems refer to systems providing different broadcast services. The different broadcast services may refer to a terrestrial broadcast service, mobile broadcast service, etc. Data related to respective broadcast services can be transmitted through different frames.

The DAC block 7800 can convert an input digital signal into an analog signal and output the analog signal. The signal output from the DAC block 7800 can be transmitted through m output antennas. A Tx antenna according to an embodiment of the present invention can have vertical or horizontal polarity.

The above-described blocks may be omitted or replaced by blocks having similar or identical functions according to design.

FIG. 8 illustrates a structure of an apparatus for receiving broadcast signals for future broadcast services according to an embodiment of the present invention.

The apparatus for receiving broadcast signals for future broadcast services according to an embodiment of the present invention can correspond to the apparatus for transmitting broadcast signals for future broadcast services, described with reference to FIG. 1. The apparatus for receiving broadcast signals for future broadcast services according to an embodiment of the present invention can include a synchronization & demodulation module 8000, a frame parsing module 8100, a demapping & decoding module 8200, an output processor 8300 and a signaling decoding module 8400. A description will be given of operation of each module of the apparatus for receiving broadcast signals.

The synchronization & demodulation module 8000 can receive input signals through m Rx antennas, perform signal detection and synchronization with respect to a system corresponding to the apparatus for receiving broadcast signals and carry out demodulation corresponding to a reverse procedure of the procedure performed by the apparatus for transmitting broadcast signals.

The frame parsing module 8100 can parse input signal frames and extract data through which a service selected by a user is transmitted. If the apparatus for transmitting broadcast signals performs interleaving, the frame parsing module 8100 can carry out deinterleaving corresponding to a reverse procedure of interleaving. In this case, the positions of a signal and data that need to be extracted can be obtained by decoding data output from the signaling decoding module 8400 to restore scheduling information generated by the apparatus for transmitting broadcast signals.

The demapping & decoding module 8200 can convert the input signals into bit domain data and then deinterleave the same as necessary. The demapping & decoding module 8200 can perform demapping for mapping applied for transmission efficiency and correct an error generated on a transmission channel through decoding. In this case, the demapping & decoding module 8200 can obtain transmission parameters necessary for demapping and decoding by decoding the data output from the signaling decoding module 8400.

The output processor 8300 can perform reverse procedures of various compression/signal processing procedures which are applied by the apparatus for transmitting broadcast signals to improve transmission efficiency. In this case, the output processor 8300 can acquire necessary control information from data output from the signaling decoding module 8400. The output of the output processor 8300 corresponds to a signal input to the apparatus for transmitting broadcast signals and may be MPEG-TSs, IP streams (v4 or v6) and generic streams.

The signaling decoding module 8400 can obtain PLS information from the signal demodulated by the synchronization & demodulation module 8000. As described above, the frame parsing module 8100, demapping & decoding module 8200 and output processor 8300 can execute functions thereof using the data output from the signaling decoding module 8400.

FIG. 9 illustrates a synchronization & demodulation module according to an embodiment of the present invention.

The synchronization & demodulation module shown in FIG. 9 corresponds to an embodiment of the synchronization & demodulation module described with reference to FIG. 8. The synchronization & demodulation module shown in FIG. 9 can perform a reverse operation of the operation of the waveform generation module illustrated in FIG. 7.

As shown in FIG. 9, the synchronization & demodulation module according to an embodiment of the present invention corresponds to a synchronization & demodulation module of an apparatus for receiving broadcast signals using m Rx antennas and can include m processing blocks for demodulating signals respectively input through m paths. The m processing blocks can perform the same processing procedure. A description will be given of operation of the first processing block 9000 from among the m processing blocks.

The first processing block 9000 can include a tuner 9100, an ADC block 9200, a preamble detector 9300, a guard sequence detector 9400, a waveform transform block 9500, a time/frequency synchronization block 9600, a reference signal detector 9700, a channel equalizer 9800 and an inverse waveform transform block 9900.

The tuner 9100 can select a desired frequency band, compensate for the magnitude of a received signal and output the compensated signal to the ADC block 9200.

The ADC block 9200 can convert the signal output from the tuner 9100 into a digital signal.

The preamble detector 9300 can detect a preamble (or preamble signal or preamble symbol) in order to check whether or not the digital signal is a signal of the system corresponding to the apparatus for receiving broadcast signals. In this case, the preamble detector 9300 can decode basic transmission parameters received through the preamble.

The guard sequence detector 9400 can detect a guard sequence in the digital signal. The time/frequency synchronization block 9600 can perform time/frequency synchronization using the detected guard sequence and the channel equalizer 9800 can estimate a channel through a received/restored sequence using the detected guard sequence.

The waveform transform block 9500 can perform a reverse operation of inverse waveform transform when the apparatus for transmitting broadcast signals has performed inverse waveform transform. When the broadcast transmission/reception system according to one embodiment of the present invention is a multi-carrier system, the waveform transform block 9500 can perform FFT. Furthermore, when the broadcast transmission/reception system according to an embodiment of the present invention is a single carrier system, the waveform transform block 9500 may not be used if a received time domain signal is processed in the frequency domain or processed in the time domain.

The time/frequency synchronization block 9600 can receive output data of the preamble detector 9300, guard sequence detector 9400 and reference signal detector 9700 and perform time synchronization and carrier frequency synchronization including guard sequence detection and block window positioning on a detected signal. Here, the time/frequency synchronization block 9600 can feed back the output signal of the waveform transform block 9500 for frequency synchronization.

The reference signal detector 9700 can detect a received reference signal. Accordingly, the apparatus for receiving broadcast signals according to an embodiment of the present invention can perform synchronization or channel estimation.

The channel equalizer 9800 can estimate a transmission channel from each Tx antenna to each Rx antenna from the guard sequence or reference signal and perform channel equalization for received data using the estimated channel.

The inverse waveform transform block 9900 may restore the original received data domain when the waveform transform block 9500 performs waveform transform for efficient synchronization and channel estimation/equalization. If the broadcast transmission/reception system according to an embodiment of the present invention is a single carrier system, the waveform transform block 9500 can perform FFT in order to carry out synchronization/channel estimation/equalization in the frequency domain and the inverse waveform transform block 9900 can perform IFFT on the channel-equalized signal to restore transmitted data symbols. If the broadcast transmission/reception system according to an embodiment of the present invention is a multi-carrier system, the inverse waveform transform block 9900 may not be used.

The above-described blocks may be omitted or replaced by blocks having similar or identical functions according to design.

FIG. 10 illustrates a frame parsing module according to an embodiment of the present invention.

The frame parsing module illustrated in FIG. 10 corresponds to an embodiment of the frame parsing module described with reference to FIG. 8. The frame parsing module shown in FIG. 10 can perform a reverse operation of the operation of the frame structure module illustrated in FIG. 6.

As shown in FIG. 10, the frame parsing module according to an embodiment of the present invention can include at least one block deinterleaver 10000 and at least one cell demapper 10100.

The block deinterleaver 10000 can deinterleave data input through data paths of the m Rx antennas and processed by the synchronization & demodulation module on a signal block basis. In this case, if the apparatus for transmitting broadcast signals performs pair-wise interleaving as illustrated in FIG. 8, the block deinterleaver 10000 can process two consecutive pieces of data as a pair for each input path. Accordingly, the block interleaver 10000 can output two consecutive pieces of data even when deinterleaving has been performed. Furthermore, the block deinterleaver 10000 can perform a reverse operation of the interleaving operation performed by the apparatus for transmitting broadcast signals to output data in the original order.

The cell demapper 10100 can extract cells corresponding to common data, cells corresponding to data pipes and cells corresponding to PLS data from received signal frames. The cell demapper 10100 can merge data distributed and transmitted and output the same as a stream as necessary. When two consecutive pieces of cell input data are processed as a pair and mapped in the apparatus for transmitting broadcast signals, as shown in FIG. 6, the cell demapper 10100 can perform pair-wise cell demapping for processing two consecutive input cells as one unit as a reverse procedure of the mapping operation of the apparatus for transmitting broadcast signals.

In addition, the cell demapper 10100 can extract PLS signaling data received through the current frame as PLS-pre & PLS-post data and output the PLS-pre & PLS-post data.

The above-described blocks may be omitted or replaced by blocks having similar or identical functions according to design.

FIG. 11 illustrates a demapping & decoding module according to an embodiment of the present invention.

The demapping & decoding module shown in FIG. 11 corresponds to an embodiment of the demapping & decoding module illustrated in FIG. 8. The demapping & decoding module shown in FIG. 11 can perform a reverse operation of the operation of the coding & modulation module illustrated in FIG. 5.

The coding & modulation module of the apparatus for transmitting broadcast signals according to an embodiment of the present invention can process input data pipes by independently applying SISO, MISO and MIMO thereto for respective paths, as described above. Accordingly, the demapping & decoding module illustrated in FIG. 11 can include blocks for processing data output from the frame parsing module according to SISO, MISO and MIMO in response to the apparatus for transmitting broadcast signals.

As shown in FIG. 11, the demapping & decoding module according to an embodiment of the present invention can include a first block 11000 for SISO, a second block 11100 for MISO, a third block 11200 for MIMO and a fourth block 11300 for processing the PLS-pre/PLS-post information. The demapping & decoding module shown in FIG. 11 is exemplary and may include only the first block 11000 and the fourth block 11300, only the second block 11100 and the fourth block 11300 or only the third block 11200 and the fourth block 11300 according to design. That is, the demapping & decoding module can include blocks for processing data pipes equally or differently according to design.

A description will be given of each block of the demapping & decoding module.

The first block 11000 processes an input data pipe according to SISO and can include a time deinterleaver block 11010, a cell deinterleaver block 11020, a constellation demapper block 11030, a cell-to-bit mux block 11040, a bit deinterleaver block 11050 and an FEC decoder block 11060.

The time deinterleaver block 11010 can perform a reverse process of the process performed by the time interleaver block 5060 illustrated in FIG. 5. That is, the time deinterleaver block 11010 can deinterleave input symbols interleaved in the time domain into original positions thereof.

The cell deinterleaver block 11020 can perform a reverse process of the process performed by the cell interleaver block 5050 illustrated in FIG. 5. That is, the cell deinterleaver block 11020 can deinterleave positions of cells spread in one FEC block into original positions thereof.

The constellation demapper block 11030 can perform a reverse process of the process performed by the constellation mapper block 5040 illustrated in FIG. 5. That is, the constellation demapper block 11030 can demap a symbol domain input signal to bit domain data. In addition, the constellation demapper block 11030 may perform hard decision and output decided bit data. Furthermore, the constellation demapper block 11030 may output a log-likelihood ratio (LLR) of each bit, which corresponds to a soft decision value or probability value. If the apparatus for transmitting broadcast signals applies a rotated constellation in order to obtain additional diversity gain, the constellation demapper block 11030 can perform 2-dimensional LLR demapping corresponding to the rotated constellation. Here, the constellation demapper block 11030 can calculate the LLR such that a delay applied by the apparatus for transmitting broadcast signals to the I or Q component can be compensated.

The cell-to-bit mux block 11040 can perform a reverse process of the process performed by the bit-to-cell demux block 5030 illustrated in FIG. 5. That is, the cell-to-bit mux block 11040 can restore bit data mapped by the bit-to-cell demux block 5030 to the original bit streams.

The bit deinterleaver block 11050 can perform a reverse process of the process performed by the bit interleaver 5020 illustrated in FIG. 5. That is, the bit deinterleaver block 11050 can deinterleave the bit streams output from the cell-to-bit mux block 11040 in the original order.

The FEC decoder block 11060 can perform a reverse process of the process performed by the FEC encoder block 5010 illustrated in FIG. 5. That is, the FEC decoder block 11060 can correct an error generated on a transmission channel by performing LDPC decoding and BCH decoding.

The second block 11100 processes an input data pipe according to MISO and can include the time deinterleaver block, cell deinterleaver block, constellation demapper block, cell-to-bit mux block, bit deinterleaver block and FEC decoder block in the same manner as the first block 11000, as shown in FIG. 11. However, the second block 11100 is distinguished from the first block 11000 in that the second block 11100 further includes a MISO decoding block 11110. The second block 11100 performs the same procedure including time deinterleaving operation to outputting operation as the first block 11000 and thus description of the corresponding blocks is omitted.

The MISO decoding block 11110 can perform a reverse operation of the operation of the MISO processing block 5110 illustrated in FIG. 5. If the broadcast transmission/reception system according to an embodiment of the present invention uses STBC, the MISO decoding block 11110 can perform Alamouti decoding.

The third block 11200 processes an input data pipe according to MIMO and can include the time deinterleaver block, cell deinterleaver block, constellation demapper block, cell-to-bit mux block, bit deinterleaver block and FEC decoder block in the same manner as the second block 11100, as shown in FIG. 11. However, the third block 11200 is distinguished from the second block 11100 in that the third block 11200 further includes a MIMO decoding block 11210. The basic roles of the time deinterleaver block, cell deinterleaver block, constellation demapper block, cell-to-bit mux block and bit deinterleaver block included in the third block 11200 are identical to those of the corresponding blocks included in the first and second blocks 11000 and 11100 although functions thereof may be different from the first and second blocks 11000 and 11100.

The MIMO decoding block 11210 can receive output data of the cell deinterleaver for input signals of the m Rx antennas and perform MIMO decoding as a reverse operation of the operation of the MIMO processing block 5220 illustrated in FIG. 5. The MIMO decoding block 11210 can perform maximum likelihood decoding to obtain optimal decoding performance or carry out sphere decoding with reduced complexity. Otherwise, the MIMO decoding block 11210 can achieve improved decoding performance by performing MMSE detection or carrying out iterative decoding with MMSE detection.

The fourth block 11300 processes the PLS-pre/PLS-post information and can perform SISO or MISO decoding. The fourth block 11300 can carry out a reverse process of the process performed by the fourth block 5300 described with reference to FIG. 5.

The basic roles of the time deinterleaver block, cell deinterleaver block, constellation demapper block, cell-to-bit mux block and bit deinterleaver block included in the fourth block 11300 are identical to those of the corresponding blocks of the first, second and third blocks 11000, 11100 and 11200 although functions thereof may be different from the first, second and third blocks 11000, 11100 and 11200.

The shortened/punctured FEC decoder 11310 included in the fourth block 11300 can perform a reverse process of the process performed by the shortened/punctured FEC encoder block 5310 described with reference to FIG. 5. That is, the shortened/punctured FEC decoder 11310 can perform de-shortening and de-puncturing on data shortened/punctured according to PLS data length and then carry out FEC decoding thereon. In this case, the FEC decoder used for data pipes can also be used for PLS. Accordingly, additional FEC decoder hardware for the PLS only is not needed and thus system design is simplified and efficient coding is achieved.

The above-described blocks may be omitted or replaced by blocks having similar or identical functions according to design.

The demapping & decoding module according to an embodiment of the present invention can output data pipes and PLS information processed for the respective paths to the output processor, as illustrated in FIG. 11.

FIGS. 12 and 13 illustrate output processors according to embodiments of the present invention.

FIG. 12 illustrates an output processor according to an embodiment of the present invention. The output processor illustrated in FIG. 12 corresponds to an embodiment of the output processor illustrated in FIG. 8. The output processor illustrated in FIG. 12 receives a single data pipe output from the demapping & decoding module and outputs a single output stream. The output processor can perform a reverse operation of the operation of the input formatting module illustrated in FIG. 2.

The output processor shown in FIG. 12 can include a BB scrambler block 12000, a padding removal block 12100, a CRC-8 decoder block 12200 and a BB frame processor block 12300.

The BB scrambler block 12000 can descramble an input bit stream by generating the same PRBS as that used in the apparatus for transmitting broadcast signals for the input bit stream and carrying out an XOR operation on the PRBS and the bit stream.

The padding removal block 12100 can remove padding bits inserted by the apparatus for transmitting broadcast signals as necessary.

The CRC-8 decoder block 12200 can check a block error by performing CRC decoding on the bit stream received from the padding removal block 12100.

The BB frame processor block 12300 can decode information transmitted through a BB frame header and restore MPEG-TSs, IP streams (v4 or v6) or generic streams using the decoded information.

The above-described blocks may be omitted or replaced by blocks having similar or identical functions according to design.

FIG. 13 illustrates an output processor according to another embodiment of the present invention. The output processor shown in FIG. 13 corresponds to an embodiment of the output processor illustrated in FIG. 8. The output processor shown in FIG. 13 receives multiple data pipes output from the demapping & decoding module. Decoding multiple data pipes can include a process of merging common data commonly applicable to a plurality of data pipes and data pipes related thereto and decoding the same or a process of simultaneously decoding a plurality of services or service components (including a scalable video service) by the apparatus for receiving broadcast signals.

The output processor shown in FIG. 13 can include a BB descrambler block, a padding removal block, a CRC-8 decoder block and a BB frame processor block as the output processor illustrated in FIG. 12. The basic roles of these blocks correspond to those of the blocks described with reference to FIG. 12 although operations thereof may differ from those of the blocks illustrated in FIG. 12.

A de-jitter buffer block 13000 included in the output processor shown in FIG. 13 can compensate for a delay, inserted by the apparatus for transmitting broadcast signals for synchronization of multiple data pipes, according to a restored TTO (time to output) parameter.

A null packet insertion block 13100 can restore a null packet removed from a stream with reference to a restored DNP (deleted null packet) and output common data.

A TS clock regeneration block 13200 can restore time synchronization of output packets based on ISCR (input stream time reference) information.

A TS recombining block 13300 can recombine the common data and data pipes related thereto, output from the null packet insertion block 13100, to restore the original MPEG-TSs, IP streams (v4 or v6) or generic streams. The TTO, DNT and ISCR information can be obtained through the BB frame header.

An in-band signaling decoding block 13400 can decode and output in-band physical layer signaling information transmitted through a padding bit field in each FEC frame of a data pipe.

The output processor shown in FIG. 13 can BB-descramble the PLS-pre information and PLS-post information respectively input through a PLS-pre path and a PLS-post path and decode the descrambled data to restore the original PLS data. The restored PLS data is delivered to a system controller included in the apparatus for receiving broadcast signals. The system controller can provide parameters necessary for the synchronization & demodulation module, frame parsing module, demapping & decoding module and output processor module of the apparatus for receiving broadcast signals.

The above-described blocks may be omitted or replaced by blocks having similar r identical functions according to design.

FIG. 14 illustrates a coding & modulation module according to another embodiment of the present invention.

The coding & modulation module shown in FIG. 14 corresponds to another embodiment of the coding & modulation module illustrated in FIGS. 1 to 5.

To control QoS for each service or service component transmitted through each data pipe, as described above with reference to FIG. 5, the coding & modulation module shown in FIG. 14 can include a first block 14000 for SISO, a second block 14100 for MISO, a third block 14200 for MIMO and a fourth block 14300 for processing the PLS-pre/PLS-post information. In addition, the coding & modulation module can include blocks for processing data pipes equally or differently according to the design. The first to fourth blocks 14000 to 14300 shown in FIG. 14 are similar to the first to fourth blocks 5000 to 5300 illustrated in FIG. 5.

However, the first to fourth blocks 14000 to 14300 shown in FIG. 14 are distinguished from the first to fourth blocks 5000 to 5300 illustrated in FIG. 5 in that a constellation mapper 14010 included in the first to fourth blocks 14000 to 14300 has a function different from the first to fourth blocks 5000 to 5300 illustrated in FIG. 5, a rotation & I/Q interleaver block 14020 is present between the cell interleaver and the time interleaver of the first to fourth blocks 14000 to 14300 illustrated in FIG. 14 and the third block 14200 for MIMO has a configuration different from the third block 5200 for MIMO illustrated in FIG. 5. The following description focuses on these differences between the first to fourth blocks 14000 to 14300 shown in FIG. 14 and the first to fourth blocks 5000 to 5300 illustrated in FIG. 5.

The constellation mapper block 14010 shown in FIG. 14 can map an input bit word to a complex symbol. However, the constellation mapper block 14010 may not perform constellation rotation, differently from the constellation mapper block shown in FIG. 5. The constellation mapper block 14010 shown in FIG. 14 is commonly applicable to the first, second and third blocks 14000, 14100 and 14200, as described above.

The rotation & I/Q interleaver block 14020 can independently interleave in-phase and quadrature-phase components of each complex symbol of cell-interleaved data output from the cell interleaver and output the in-phase and quadrature-phase components on a symbol-by-symbol basis. The number of number of input data pieces and output data pieces of the rotation & I/Q interleaver block 14020 is two or more which can be changed by the designer. In addition, the rotation & I/Q interleaver block 14020 may not interleave the in-phase component.

The rotation & I/Q interleaver block 14020 is commonly applicable to the first to fourth blocks 14000 to 14300, as described above. In this case, whether or not the rotation & I/Q interleaver block 14020 is applied to the fourth block 14300 for processing the PLS-pre/post information can be signaled through the above-described preamble.

The third block 14200 for MIMO can include a Q-block interleaver block 14210 and a complex symbol generator block 14220, as illustrated in FIG. 14.

The Q-block interleaver block 14210 can permute a parity part of an FEC-encoded FEC block received from the FEC encoder. Accordingly, a parity part of an LDPC H matrix can be made into a cyclic structure like an information part. The Q-block interleaver block 14210 can permute the order of output bit blocks having Q size of the LDPC H matrix and then perform row-column block interleaving to generate final bit streams.

The complex symbol generator block 14220 receives the bit streams output from the Q-block interleaver block 14210, maps the bit streams to complex symbols and outputs the complex symbols. In this case, the complex symbol generator block 14220 can output the complex symbols through at least two paths. This can be modified by the designer.

The above-described blocks may be omitted or replaced by blocks having similar or identical functions according to design.

The coding & modulation module according to another embodiment of the present invention, illustrated in FIG. 14, can output data pipes, PLS-pre information and PLS-post information processed for respective paths to the frame structure module.

FIG. 15 illustrates a demapping & decoding module according to another embodiment of the present invention.

The demapping & decoding module shown in FIG. 15 corresponds to another embodiment of the demapping & decoding module illustrated in FIG. 11. The demapping & decoding module shown in FIG. 15 can perform a reverse operation of the operation of the coding & modulation module illustrated in FIG. 14.

As shown in FIG. 15, the demapping & decoding module according to another embodiment of the present invention can include a first block 15000 for SISO, a second block 11100 for MISO, a third block 15200 for MIMO and a fourth block 14300 for processing the PLS-pre/PLS-post information. In addition, the demapping & decoding module can include blocks for processing data pipes equally or differently according to design. The first to fourth blocks 15000 to 15300 shown in FIG. 15 are similar to the first to fourth blocks 11000 to 11300 illustrated in FIG. 11.

However, the first to fourth blocks 15000 to 15300 shown in FIG. 15 are distinguished from the first to fourth blocks 11000 to 11300 illustrated in FIG. 11 in that an I/Q deinterleaver and derotation block 15010 is present between the time interleaver and the cell deinterleaver of the first to fourth blocks 15000 to 15300, a constellation mapper 15010 included in the first to fourth blocks 15000 to 15300 has a function different from the first to fourth blocks 11000 to 11300 illustrated in FIG. 11 and the third block 15200 for MIMO has a configuration different from the third block 11200 for MIMO illustrated in FIG. 11. The following description focuses on these differences between the first to fourth blocks 15000 to 15300 shown in FIG. 15 and the first to fourth blocks 11000 to 11300 illustrated in FIG. 11.

The I/Q deinterleaver & derotation block 15010 can perform a reverse process of the process performed by the rotation & I/Q interleaver block 14020 illustrated in FIG. 14. That is, the I/Q deinterleaver & derotation block 15010 can deinterleave I and Q components I/Q-interleaved and transmitted by the apparatus for transmitting broadcast signals and derotate complex symbols having the restored I and Q components.

The I/Q deinterleaver & derotation block 15010 is commonly applicable to the first to fourth blocks 15000 to 15300, as described above. In this case, whether or not the I/Q deinterleaver & derotation block 15010 is applied to the fourth block 15300 for processing the PLS-pre/post information can be signaled through the above-described preamble.

The constellation demapper block 15020 can perform a reverse process of the process performed by the constellation mapper block 14010 illustrated in FIG. 14. That is, the constellation demapper block 15020 can demap cell-deinterleaved data without performing derotation.

The third block 15200 for MIMO can include a complex symbol parsing block 15210 and a Q-block deinterleaver block 15220, as shown in FIG. 15.

The complex symbol parsing block 15210 can perform a reverse process of the process performed by the complex symbol generator block 14220 illustrated in FIG. 14. That is, the complex symbol parsing block 15210 can parse complex data symbols and demap the same to bit data. In this case, the complex symbol parsing block 15210 can receive complex data symbols through at least two paths.

The Q-block deinterleaver block 15220 can perform a reverse process of the process carried out by the Q-block interleaver block 14210 illustrated in FIG. 14. That is, the Q-block deinterleaver block 15220 can restore Q size blocks according to row-column deinterleaving, restore the order of permuted blocks to the original order and then restore positions of parity bits to original positions according to parity deinterleaving.

The above-described blocks may be omitted or replaced by blocks having similar or identical functions according to design.

As illustrated in FIG. 15, the demapping & decoding module according to another embodiment of the present invention can output data pipes and PLS information processed for respective paths to the output processor.

As described above, the apparatus and method for transmitting broadcast signals according to an embodiment of the present invention can multiplex signals of different broadcast transmission/reception systems within the same RF channel and transmit the multiplexed signals and the apparatus and method for receiving broadcast signals according to an embodiment of the present invention can process the signals in response to the broadcast signal transmission operation. Accordingly, it is possible to provide a flexible broadcast transmission and reception system.

Hereinafter, a frequency interleaving procedure according to an embodiment of the present invention will be described.

The purpose of the block interleaver 6200 in the present invention, which operates on a single OFDM symbol, is to provide frequency diversity by randomly interleaving data cells received from the frame structure module 1200. In order to get maximum interleaving gain in a single signal frame (or frame), a different interleaving-seed is used for every OFDM symbol pair comprised of two sequential OFDM symbols.

The block interleaver 6200 may interleave cells in a transport block as a unit of a signal frame to acquire additional diversity gain. The block interleaver 6200 according to an embodiment of the present invention may be referred to as a frequency interleaver, which can be changed according to a designer's intention. According to an embodiment of the present invention, the block interleaver 6200 may apply different interleaving seeds to at least one OFDM symbol or apply different interleaving seeds to a frame including a plurality of OFDM symbols.

In the present invention, the aforementioned frequency interleaving method may be referred to as random frequency interleaving (random FI).

In addition, according to an embodiment of the present invention, the random FI may be applied to a super-frame structure including a plurality of signal frames with a plurality of OFDM symbols.

As described above, a broadcast signal transmitting apparatus or a frequency interleaver therein according to an embodiment of the present invention may apply different interleaving seeds (or interleaving patterns) for at least one OFDM symbol, that is, for each OFDM symbol or each of pair-wise OFDM symbols and perform the random FI, thereby acquiring frequency diversity. In addition, the frequency interleaver according to an embodiment of the present invention may apply different interleaving seed for each respective signal frame and perform the random FI, thereby acquiring additional frequency diversity.

Accordingly, a broadcast transmitting apparatus or a frequency interleaver according to an embodiment of the present invention may have a ping-pong frequency interleaver structure that perform frequency interleaving in units of one pair of consecutive OFDM symbols (pair-wise OFDM symbol) using two memory banks. Hereinafter, an interleaving operation of the frequency interleaver according to an embodiment of the present invention may be referred to as pair-wise symbol FI (or pair-wise FI) or ping-pong FI (ping-pong interleaving). The aforementioned interleaving operation corresponds to an embodiment of the random FI, which can be changed according to a designer's intention.

Even-indexed pair-wise OFDM symbols and odd pair-wise OFDM symbols may be intermittently interleaved via different FI memory banks. In addition, the frequency interleaver according to an embodiment of the present invention may simultaneously perform reading and writing operations on one pair of consecutive OFDM symbols input to each memory bank using an arbitrary interleaving seed. A detailed operation will be described below.

In addition, according to an embodiment of the present invention, as a logical frequency interleaving operation for logically and effectively interleaving all OFDM symbols in a super-frame, an interleaving seed is basically changed in units of one pair of OFDM symbols.

In this case, according to an embodiment of the present invention, the interleaving seed may be generated by an arbitrary random generator or a random generator formed by a combination of various random generators. In addition, according to an embodiment of the present invention, various interleaving seeds may be generated by cyclic-shifting one main interleaving seed in order to effectively change an interleaving seed. In this case, a cyclic-shifting rule may be hierarchically defined in consideration of OFDM symbol and signal frame units. This can be changed according to a designer's intention, which will be described in detail.

A broadcast signal receiving apparatus according to an embodiment of the present invention may perform an inverse procedure of the aforementioned random frequency interleaving. In this case, the broadcast signal receiving apparatus or a frequency deinterleaver thereof according to an embodiment of the present invention may not use a ping-pong structure using a double-memory and may perform deinterleaving on consecutive input OFDM symbols via a single-memory. Accordingly, memory use efficiency can be enhanced. In addition, reading and writing operations are still required, which is called as a single-memory deinterleaving operation. Such a deinterleaving scheme is very efficient in a memory-use aspect.

FIG. 16 is a view illustrating an operation of a frequency interleaver according to an embodiment of the present invention.

FIG. 16 illustrates the basic operation of the frequency interleaver using two memory banks at the transmitter, which enables a single-memory deinterleaving at the receiver.

As described above, the frequency interleaver according to an embodiment of the present invention may perform a ping-pong interleaving operation.

Typically, ping-pong interleaving operation is accomplished by means of two memory banks. In the proposed FI operation, two memory banks are for each pair-wise OFDM symbol.

The maximum memory ROM (Read Only Memory) size for interleaving is approximately two times to a maximum FFT size. At a transmit side, the ROM size increase is rather less critical, compared to a receiver side.

As described above, odd pair-wise OFDM symbols and odd pair-wise OFDM symbols may be intermittently interleaved via different FI memory-banks. That is, the second (odd-indexed) pair-wise OFDM symbol is interleaved in the second bank, while the first (even-indexed) pair-wise OFDM symbol is interleaved in the first bank and so on. For each pair-wise OFDM symbol, a single interleaving seed is used. Based on the interleaving seed and reading-writing (or writing-reading) operation, two OFDM symbols are sequentially interleaved.

Reading-writing operations according to an embodiment of the present invention are simultaneously accomplished without a collision. Writing-reading operations according to an embodiment of the present invention are simultaneously accomplished without a collision.

FIG. 16 illustrates an operation of the aforementioned frequency interleaver. As illustrated in FIG. 16, the frequency interleaver may include a demux 16000, two memory banks, a memory bank-A 16100 and a memory bank-B 16200, and a demux 16300.

First, the frequency interleaver according to an embodiment of the present invention may perform a demultiplexing processing to the input sequential OFDM symbols for the pair-wise OFDM symbol FI. Then the frequency interleaver according to an embodiment of the present invention performs a reading-writing FI operation in each memory bank A and B with a single interleaving seed. As shown in FIG. 16, two memory banks are used for each OFDM symbol pair. Operationally, the first (even-indexed) OFDM symbol pair is interleaved in memory bank-A, while the second (odd-indexed) OFDM symbol pair is interleaved in memory bank-B and so on, alternating between A and B.

Then the frequency interleaver according to an embodiment of the present invention may perform a multiplexing processing to ping-pong FI outputs for sequential OFDM symbol transmission.

FIG. 17 illustrates a basic switch model for MUX and DEMUX procedures according to an embodiment of the present invention.

FIG. 17 illustrates simple operations the DEMUX and MUX applied input and output of memory-bank-A/-B in the aforementioned ping-pong FI structure.

The DEMUX and MUX may control the input sequential OFDM symbols to be interleaved, and the output OFDM symbol pair to be transmitted, respectively. Different interleaving seeds are used for every OFDM symbol pair.

Hereinafter, reading-writing operations of frequency interleaving according to an embodiment of the present invention will be described.

A frequency interleaver according to an embodiment of the present invention may select or use a single interleaving see and use the interleaving seed in writing and reading operations for the first and second OFDM symbols, respectively. That is, the frequency interleaver according to an embodiment of the present invention may use the one selected arbitrary interleaving seed in an operation of writing a first OFDM symbol of a pair-wise OFDM symbol, and use a second OFDM symbol in a reading operation, thereby achieving effective interleaving. Virtually, it seems like that two different interleaving seeds are applied to two OFDM symbols, respectively.

Details of the reading-writing operation according to an embodiment of the present invention are as follows:

For the first OFDM symbol, the frequency interleaver according to an embodiment of the present invention may perform random writing into memory (according to an interleaving seed) and perform then linear reading. For the second OFDM symbol, the frequency interleaver according to an embodiment of the present invention may perform linear writing into memory, (affected by the linear reading operation for the first OFDM symbol), simultaneously. Also, the frequency interleaver according to an embodiment of the present invention may perform then random reading (according to an interleaving seed).

As described above, the broadcast signal receiving apparatus according to an embodiment of the present invention may continuously transmit a plurality of frames on the time axis. In the present invention, a set of signal frames transmitted for a predetermined period of time may be referred to as a super-frame. Accordingly, one super-frame may include N signal frames and each signal frame may include a plurality of OFDM symbols.

FIG. 18 is a view illustrating a concept of frequency interleaving applied to a single super-frame according to an embodiment of the present invention.

A frequency interleaver according to an embodiment of the present invention may change interleaving seed every pair-wise OFDM symbol in a single signal frame (symbol index reset) and change interleaving seed to be used in a single signal frame by every frame (frame index reset). Consequently, the frequency interleaver according to an embodiment of the present invention may change interleaving seed in a super-frame (super-frame index reset).

Accordingly, the frequency interleaver according to an embodiment of the present may logically and effectively interleave all OFDM symbols in a super-frame.

FIG. 19 is a view illustrating logical operation mechanism of frequency interleaving applied to a single super-frame according to an embodiment of the present invention.

FIG. 19 illustrates logical operation mechanism of a frequency interleaver and related parameter thereof, for effectively changing interleaving seeds to be used the one super-frame described with reference to FIG. 18.

As described above, in the present invention, various interleaving seeds may be effectively generated by cyclic-shifting one main interleaving seed by as much as an arbitrary offset. As illustrated in FIG. 19, according to an embodiment of the present invention, the aforementioned offset may be differently generated for each frame and each of pair-wise OFDM symbol to generate different interleaving seeds. Hereinafter, the logical operation mechanism will be described.

As illustrated in a lower block of FIG. 19, a frequency interleaver according to an embodiment of the present invention may randomly generate a frame offset for each signal frame using an input frame index. The frame offset according to an embodiment of the present invention may be generated by a frame offset generator included in a frequency interleaver. In this case, when super-frame index is reset, a frame offset applied to each frame is generated for each signal frame in each super-frame identified according to a super-frame index.

As illustrated in a middle block of FIG. 19, a frequency interleaver according to an embodiment of the present invention may randomly generate a symbol offset to be applied to each OFDM symbol included in each signal frame using an input symbol index. The symbol offset according to an embodiment of the present invention may be generated by a symbol offset generator included in a frequency interleaver. In this case, when a frame index is reset, a symbol offset for each symbol is generated for symbols in each signal frame identified according to a frame index. In addition, the frequency interleaver according to an embodiment of the present invention may generate various interleaving seeds by cyclic-shifting a main interleaving seed on each OFDM symbol by as much as a symbol offset.

Then, as illustrated in an upper block of FIG. 19, a frequency interleaver according to an embodiment of the present invention may perform random FI on cells included in each OFDM symbol using an input cell index. A random FI parameter according to an embodiment of the present invention may be generated by a random FI generator included in the frequency interleaver.

FIG. 20 illustrates math figures of logical operation mechanism of frequency interleaving applied to a single super-frame according to an embodiment of the present invention.

In detail, FIG. 20 illustrates a correlation of the aforementioned frame offset parameter, symbol offset, parameter, and random FI applied to a cell included in each OFDM. As illustrated in FIG. 20, an offset to be used in an OFDM symbol may be generated through a hierarchical structure of the aforementioned frame offset generator and the aforementioned symbol offset generator. In this case, the frame offset generator and the symbol offset generator may be designed using a arbitrary random generator.

FIG. 21 illustrates an operation of a memory bank according to an embodiment of the present invention.

As described above, two memory banks according to an embodiment of the present invention may apply an arbitrary interleaving seed generated via the aforementioned procedure to each pair-wise OFDM symbol. In addition, each memory bank may change interleaving seed every pair-wise OFDM symbol.

FIG. 22 illustrates a frequency deinterleaving procedure according to an embodiment of the present invention.

A broadcast signal receiving apparatus according to an embodiment of the present invention may perform an inverse procedure of the aforementioned frequency interleaving procedure. FIG. 22 illustrates single-memory deinterleaving (FDI) for input sequential OFDM symbols.

Basically, frequency deinterleaving operation follows to the inverse processing of frequency interleaving operation. For a single-memory use, no further processing is required.

When pair-wise OFDM symbols illustrated in a left portion of FIG. 22 are input, the broadcast signal receiving apparatus according to an embodiment of the present invention may perform the aforementioned reading and writing operation using a single memory, as illustrated in a right portion of FIG. 22. In this case, the broadcast signal receiving apparatus according to an embodiment of the present invention may generate a memory-index and perform frequency deinterleaving (reading and writing) corresponding to an inverse procedure of frequency interleaving (writing and reading) performed by a broadcast signal transmitting apparatus. The benefit is inherently caused by the proposed pair-wise ping-pong interleaving architecture.

As described above, a waveform transform block 9500 may perform FFT transformation on input data. According to an embodiment of the present invention, an FFT size may be 4K, 8K, 16K, 32K, or the like, and an FFT mode indicating the FFT size may be defined. The aforementioned FFT mode may be signaled via a preamble (or a preamble signal, a preamble symbol) in a signal frame or signal via PLS-pre or PLS-post. The FFT size may be changed according to a designer's intention.

A frequency interleaver or an interleaving seed generator included therein according to an embodiment of the present invention may perform an operation according to the aforementioned FFT mode. In addition, an interleaving seed generator according to an embodiment of the present invention may include a random seed generator and a quasi-random interleaving seed generator.

In this situation, an apparatus for transmitting broadcast signals according to an embodiment of the present invention can perform MIMO processing or MISO processing DP data or service data which is transmitted through each DP. In the present invention the MIMO processing/MISO processing can be referred to MIXO mode. According to the MIXO mode, the data carriers may be interleaved in pairs. This means that the frequency interleaver according to an embodiment of the present invention in a given FFT mode is required to generate only half of the memory-index compared to when operating with single-input single-output (SISO).

Specifically, for 8K FFT mode, a (quasi-) random interleaving-seed generator for used in 4K FFT mode is exploited, and for 16K FFT mode, a (quasi-) random interleaving-seed generator for used in 8K FFT mode is exploited. For 32K FFT mode, a (quasi-) random interleaving-seed generator for used in 16K FFT mode is exploited.

The following math figures show a change procedure of interleaving seed in each of the aforementioned memory banks.

MathFigure 1 for $j=0,1,\ldots,N_{sym}$ and for $k=0,1,\ldots,N_{data}$, $$F_j(C_j(k)) = X_j(k)$$

where $C_j(k) = (T(k) + S_{\lfloor j/2 \rfloor}) \bmod N_{data}$ [Math.1]

T(k) is a main interleaving seed generated by a random generator, used in the main FI $S_{\lfloor j/2 \rfloor}$ is a random symbol offset generated by a random generator, used in the jth pair-wise OFDM symbol MathFigure 2 for $j = 0, 1, \ldots, N_{sym}$ and $k = 0, 1, \ldots, N_{data}$ $$F_j(k) = X_j(C_j(k))$$ [Math.2]

where $C_j(k)$ is the same random seed used for the first symbol

The above expression 1 is for the first OFDM symbol, i.e., (j mod 2)=0 of the ith pair-wise OFDM symbol and the above expression 2 is for the second OFDM symbol, i.e., (j mod 2)=1 of the ith pair-wise OFDM symbol.emory banks.

Each math figure shows an operation of the frequency interleaver which performs frequency interleaving every OFDM symbol by using different interleaving seed. In this situation, the frequency interleaver according to an embodiment of the present invention may perform pair-wise cell interleaving which is applied to the aforementioned MIXO mode.

FIG. 23 is a view illustrating single-memory deinterleaving for input sequential OFDM symbols.

FIG. 23 is a view illustrating concept of a broadcast signal receiving apparatus or a frequency deinterleaver thereof, for applying interleaving seed used in a broadcast signal transmitting apparatus (or a frequency interleaver) to each pair-wise OFDM symbol to perform deinterleaving.

As described above, the broadcast signal receiving apparatus according to an embodiment of the present invention may perform an inverse procedure of the aforementioned frequency interleaving procedure using a single memory. FIG. 23 illustrates an operation of the broadcast signal receiving apparatus for processing single-memory deinterleaving (FDI) for input sequential OFDM symbols.

The broadcast signal receiving apparatus according to an embodiment of the present invention may perform an inverse procedure of the aforementioned operation of a frequency interleaver. Thus, deinterleaving seeds correspond to the aforementioned interleaving seed.

FIG. 24 is a flowchart illustrating a method for transmitting broadcast signals according to an embodiment of the present invention.

The apparatus for transmitting broadcast signals according to an embodiment of the present invention can encode service data (S24000). As described above, service data is transmitted through a data pipe which is a logical channel in the physical layer that carries service data or related metadata, which may carry one or multiple service(s) or service component(s). Data carried on a data pipe can be referred to as the DP data or the service data. The detailed process of step S24000 is as described in FIG. 1 or 5.

The apparatus for transmitting broadcast signals according to an embodiment of the present invention can build at least one signal frame including the encoded service data (S24010). The detailed process of this step is as described in FIG. 6.

Then, the apparatus for transmitting broadcast signals according to an embodiment of the present invention can map the encoded service data into OFDM symbols of the signal frame and frequency interleave the mapped service data. As above described, the basic function of the cell mapper 2500 is to map data cells for each of the DPs, PLS data, if any, into arrays of active OFDM cells corresponding to each of the OFDM symbols within a signal frame. Then, the block interleaver 6200 may operate on a single OFDM symbol basis, provide frequency diversity by randomly interleaving the cells received from the cell mapper 2500. The purpose of the block interleaver 6200 in the present invention, which operates on a single OFDM symbol, is to provide frequency diversity by randomly interleaving data cells received from the frame structure module 1200. In order to get maximum interleaving gain in a single signal frame (or frame), a different interleaving-seed is used for every OFDM symbol pair comprised of two sequential OFDM symbols. The detailed process of the frequency interleaving is as described in FIGS. 16 to 23.

Subsequently, the apparatus for transmitting broadcast signals according to an embodiment of the present invention can modulate data in the built at least one signal frame by an OFDM (Orthogonal Frequency Division Multiplexing) scheme (S24020). The detailed process of this step is as described in FIG. 1 or 7.

The apparatus for transmitting broadcast signals according to an embodiment of the present invention can transmit the broadcast signals including the modulated data (S24030). The detailed process of this step is as described in FIG. 1 or 7.

FIG. 25 is a flowchart illustrating a method for receiving broadcast signals according to an embodiment of the present invention.

The flowchart shown in FIG. 25 corresponds to a reverse process of the broadcast signal transmission method according to an embodiment of the present invention, described with reference to FIG. 24.

The apparatus for receiving broadcast signals according to an embodiment of the present invention can receive broadcast signals (S25000). The apparatus for receiving broadcast signals according to an embodiment of the present invention can demodulate the received broadcast signals using an OFDM (Orthogonal Frequency Division Multiplexing) scheme (S25010). Details are as described in FIG. 8 or 9.

The apparatus for receiving broadcast signals according to an embodiment of the present invention can parse at least one signal frame from the demodulated broadcast signals (S25020). Details are as described in FIG. 8 or 10. In this case, the apparatus for receiving broadcast signals according to an embodiment of the present invention can perform frequency de-interleaving corresponds to a reverse process of the frequency interleaving as shown in the above. The detailed process of the frequency interleaving is as described in FIGS. 16 to 23.

Subsequently, the apparatus for receiving broadcast signals according to an embodiment of the present invention can decode data in the parsed at least one signal frame to output service data (S25030). Details are as described in FIG. 8 or 11 and FIG. 15.

As described above, service data is transmitted through a data pipe which is a logical channel in the physical layer that carries service data or related metadata, which may carry one or multiple service(s) or service component(s). Data carried on a data pipe can be referred to as the DP data or the service data.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

MODE FOR THE INVENTION

Various embodiments have been described in the best mode for carrying out the invention.

INDUSTRIAL APPLICABILITY

The present invention is available in a series of broadcast signal provision fields.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The invention claimed is:

1. A method for transmitting broadcast signals, the method comprising:
   encoding service data;
   building at least one signal frame including the encoded service data,
   wherein the at least one signal frame includes a plurality of symbols;
   frequency interleaving data cells in a symbol of the at least one signal frame by using an interleaving-sequence and a symbol offset value,
   wherein the symbol offset value is generated for every symbol pair comprised of two sequential symbols,
   wherein the data cells are included in a symbol with a symbol index and a frame with a frame index, and the frequency interleaving of the data cells operates on a frame basis, and
   wherein the frequency interleaving of the data cells is reset when a first signal frame is changed to a second signal frame;
   modulating data in the at least one signal frame by an Orthogonal Frequency Division Multiplex (OFDM) scheme; and
   transmitting the broadcast signals having the modulated data.

2. An apparatus for transmitting broadcast signals, the apparatus comprising:
   an encoder to encode service data;
   a mapper to map the encoded service data into a plurality of symbols to build at least one signal frame;
   a frequency interleaver to frequency interleave data cells in a symbol of the at least one signal frame by using an interleaving-sequence and a symbol offset value,
   wherein the symbol offset value is generated for every symbol pair comprised of two sequential symbols,
   wherein the data cells are included in a symbol with a symbol index and a frame with a frame index, and the frequency interleaver operates on a frame basis, and
   wherein the frequency interleaver is reset when a first signal frame is changed to a second signal frame;
   a modulator to modulate data in the at least one signal frame by an Orthogonal Frequency Division Multiplex (OFDM) scheme; and
   a transmitter to transmit the broadcast signals having the modulated data.

3. A method for receiving broadcast signals, the method comprising:
   receiving the broadcast signals;
   demodulating the received broadcast signals by an Orthogonal Frequency Division Multiplex (OFDM) scheme;
   frequency deinterleaving data cells in a symbol of at least one signal frame by using a deinterleaving-sequence and a symbol offset value,
   wherein the symbol offset value is generated for every symbol pair comprised of two sequential symbols,
   wherein the data cells are included in a symbol with a symbol index and a frame with a frame index, and the frequency deinterleaving of the data cells operates on a frame basis, and
   wherein the frequency deinterleaving of the data cells is reset when a first signal frame is changed to a second signal frame;
   parsing the at least one signal frame from the demodulated broadcast signals; and
   decoding data in the parsed at least one signal frame to output service data.

4. An apparatus for receiving broadcast signals, the apparatus comprising:
   a receiver to receive the broadcast signals;
   a demodulator to demodulate the received broadcast signals by an Orthogonal Frequency Division Multiplex (OFDM) scheme;
   a frequency deinterleaver to deinterleave data cells in a symbol of at least one signal frame by using a deinterleaving-sequence and a symbol offset value,
   wherein the symbol offset value is generated for every symbol pair comprised of two sequential symbols,
   wherein the data cells are included in a symbol with a symbol index and a frame with a frame index, and the frequency deinterleaver operates on a frame basis, and
   wherein the frequency deinterleaver is reset when a first signal frame is changed to a second signal frame;
   a demapper to demap service data from the at least one signal frame in the demodulated broadcast signals; and
   a decoder to decode the service data in the at least one signal frame.

* * * * *